USOO5757008A

United States Patent [19]

Akagawa et al.

[11] Patent Number: 5,757,008
[45] Date of Patent: May 26, 1998

[54] INFRARED-RAY IMAGE SENSOR

[75] Inventors: Keiichi Akagawa, Kamakura; Tetsuya Tomofuji, Kawasaki, both of Japan

[73] Assignee: Nikon Corporation, Tokyo, Japan

[21] Appl. No.: 747,077

[22] Filed: Nov. 8, 1996

[30] Foreign Application Priority Data

| | | | |
|---|---|---|---|
| Nov. 8, 1995 | [JP] | Japan | 7-289543 |
| Dec. 8, 1995 | [JP] | Japan | 7-345549 |
| Mar. 7, 1996 | [JP] | Japan | 8-049716 |
| Jul. 10, 1996 | [JP] | Japan | 8-199609 |

[51] Int. Cl.$^6$ ............................................. G01J 1/02
[52] U.S. Cl. .................. 250/370.08; 250/332; 250/338.4
[58] Field of Search .......................... 250/370.08, 332, 250/338.4

[56] References Cited

U.S. PATENT DOCUMENTS 4,962,303  10/1990  Chu .................................. 250/370.08
5,021,663   6/1991  Hornbeck .............................. 250/349

FOREIGN PATENT DOCUMENTS 8-105794  4/1996  Japan .

OTHER PUBLICATIONS

M. Kumura et al., "Schottky Barrier Thermistor on the Micro-Air-Bridge", The 7th International Conference on Solid-State Sensors and Actuators, pp. 746–749.

Primary Examiner—Don Wong
Attorney, Agent, or Firm—Foley & Lardner

[57] ABSTRACT

A power source is electrically connected to a capacitance element arranged corresponding to either a Shottky barrier diode (SBD) or a bolometer at a predetermined timing through a resistor by a driving pulse provided from a horizontal scanning circuit and a driving pulse provided from a vertical scanning circuit. At this time, charges charged by a voltage of the power source in the Shottky barrier diode are discharged by either a reverse current of the Shottky barrier diode or a current through the bolometer, immediately after the power source is disconnected from the capacitance element, arranged for either the Shottky barrier diode or the bolometer. After a storing period of time, when the power source and the capacitance element are connected, the charges corresponding to the charge amount discharged for the storing period of time are charged in the capacitance element. At this time, a voltage according to the charge amount is provided. Thus, an infrared-ray image sensor can be obtained using a Shottky barrier diode or a bolometer.

30 Claims, 21 Drawing Sheets

- 1a n-TYPE EPITAXIAL LAYER
- 5 THERMAL SiO2 FILM
- 2 SHOTTKY JUNCTION SECTION
- 3 UPPER METAL ELECTRODE
- 4 p-TYPE REGION
- 1 SUBSTRATE
- 6 ELECTRODE
- 9 POWER SOURCE

| SBT MATERIAL | | STORING TIME [msec] | B CONSTANT | SHOTTKY BARRIER HEIGHT [eV] |
|---|---|---|---|---|
| SILICON SUBSTRATE | METAL SILICIDE | | | |
| n-TYPE <111> | PLATINUM | 30 | 9400 | 0.81 |
| | NICKEL | 20 | 8900 | 0.77 |
| | TUNGSTEN | LESS THAN ONE | 8400 | 0.72 |
| n-TYPE <100> | PLATINUM | 500 | 10700 | 0.92 |
| | NICKEL | LESS THAN ONE | 7400 | 0.64 |
| | CHROMIUM | LESS THAN ONE | 6600 | 0.57 |
| | TITANIUM | LESS THAN ONE | 7000 | 0.60 |
| | TUNGSTEN | LESS THAN ONE | 7500 | 0.65 |

Fig.13

TABLE V. Schottky Barrier Heights ($\phi B$) of Various Silicides On n-Type Silicon

| Disilicides | $\phi B$(eV) | Other Silicides | $\phi B$(eV) |
|---|---|---|---|
| TiSi$_2$ | 0.6 | HfSi | 0.53 |
| VSi$_2$ | 0.65 | MnSi | 0.76 |
| CrSi$_2$ | 0.57 | CoSi | 0.68 |
| ZrSi$_2$ | 0.55 | NiSi | 0.7 |
| NbSi$_2$ | — | Ni$_2$Si | 0.7 |
| MoSi$_2$ | 0.55 | RhSi | 0.74 |
| HfSi$_2$ | — | Pd$_2$Si | 0.74 |
| TaSi$_2$ | 0.59 | Pt$_2$Si | 0.78 |
| WSi$_2$ | 0.65 | PtSi | 0.87 |
| FeSi$_2$ | — | IrSi | 0.93 |
| CoSi$_2$ | 0.64 | Ir$_2$Si$_3$ | 0.85 |
| NiSi$_2$ | 0.7 | IrSi$_3$ | 0.94 |

INFRARED-RAY IMAGE SENSOR

BACKGROUND OF THE INVENTION

1. Field of the Invention

The present invention relates to a thermal infrared-ray image sensor, particularly to a thermal infrared-ray image sensor which is capable of obtaining an infrared-ray image using, for example, a Shottky barrier diode or a bolometer in a light receiving section.

2. Related Background Art

Recent years, in a field of infrared-ray detectors, development for quantum type infrared-ray image sensors utilizing substances such as PtSi, InSb, or HgCdTe for a photoelectric conversion has been advanced. However, in these quantum type infrared-radiation image sensors, elements mounted therein must be cooled. On the other hand, thermal infrared-ray sensors such pyroelectric type has a low sensitivity, although cooling of the element is not needed.

Recently, advancement in a micro-machine technology has developed an art to provide a space at a bottom of the light receiving section. Thus, sensitivity of the thermal infrared-ray sensor is greatly enhanced, and possibility to fabricate various kinds of the thermal infrared-ray sensors with an image sensor is brought about.

One of various kinds of the thermal sensors is a Shottky barrier thermistor, disclosed in "Shottky Barrier Thermistor on the Micro-Air-Bridge" M. Kimura, the 7th International Conference on Solid-State Sensors and Actuators pp 746–749. This Shottky barrier thermistor utilizes a property that a reverse direction current flowing through a Shottky barrier diode formed of such as $MoSi_2$, NiSi, or PtSi varies greatly depending on element temperature on application of a reverse bias voltage across it.

FIG. 1 shows an example of a structure of a conventional Shottky junction temperature sensor. This Shottky junction temperature sensor has a p-n junction fabricated in the following manner. Specifically, in a silicon (Si) substrate having an n-type epitaxial layer 1a on a high concentration n-type substrate, a p-type region 4 having a doughnut-shape is formed by doping boron (B) into the n-type epitaxial layer 1a by a thermal diffusion using an upper thermal $SiO_2$ film 5 as a mask, thereby forming a p-n junction. Moreover, a thermal $SiO_2$ film under the silicon Si substrate is etched, alminium (Al) is deposited by evaporation to be cintered, so that an ohmic lower electrode 6 is formed.

The upper thermal $SiO_2$ film 5 is partially etched by a photolithography technique in its inner portion of a circle having a center which is the center of the p-type region 4 and a radius which is from the center of the circle to a middle of inner and outer radius. An aliminium film is deposited on the entire surface of the resultant structure and this film is patterned thereby forming an upper metal electrode 3 of a Shottky junction diode. A diameter of the Shottky junction section 2 can be set to be, for example, 0.5 mm.

Moreover, the Shottky junction temperature sensor is such designed that a reverse voltage Va is normally applied to the Shottky junction diode from a power source (E) 9 through an operational amplifier (hereinafter referred to as an OP amplifier) 7. Such normal application of the reverse voltage Va to the Shottky junction diode shall be called "current mode".

Since a current flowing through the Shottky junction diode is provided to a feedback resistor (Rf) 8 fitted to the OP amplifier 7 and a voltage drop across the feedback resistor 8 is equal to an output voltage Vo of the OP amplifier 7, a current flowing through the Shottky junction diode can be measured by measuring the output voltage Vo.

FIG. 2 is a graph illustrating an outline of voltage V-current I of the Shottky junction diode under the conditions that temperatures $T_1$ and $T_2$ are used as parameters in a relationship $T_1 < T_2$. In this case, as the applied reverse voltage Va becomes than about $-3$ V, namely, it moves into a minus direction, currents will flows greatly, such as a current based on an applied voltage dependency of mirror image force, a tunnel current, and a leak current flowing through a periphery of the junction, other than a reverse saturation current Is.

In a Shottky junction diode formed of an n-type silicon at a room temperature T of about 300K, the applied reverse voltage Va is considered to correspond substantially the saturation current Is near $-0.5$ V. An initial region where the current flowing through the Shottky junction diode can be considered as the saturation current Is, in other word, where a current other than the saturation current Is can be neglected, the applied reverse voltage Va is considered to be $-0.3$ to $-3.0$ V.

From the above description, when a voltage of the power source 9 in FIG. 1 is set to be, for example, $-1.0$ V, this value corresponding to the initial region where the current flowing through the Shottky junction diode can be regarded as the reverse current Is, the applied reverse voltage Va to the Shottky junction diode will be set also to be $-1.0$ V. This is because, in the circuit shown in FIG. 6, the voltage of the power source 9 is applied to the Shottky junction diode completely as the applied reverse voltage Va.

By applying the above-described constant reverse voltage of for example, $-1.0$ V to the Shottky junction diode and by obtaining the saturation current $I_{s1}$ at a temperature $T_1$ and the saturation current $Is_2$ at a temperature $T_2$ from the measurement of the output voltage Vo of the OP amplifier 7 as shown in FIG. 2, an exponential functional temperature dependency gives a temperature T according to a predetermined outputvoltage $V_O$. The exponential functional temperature dependency is expressed as $\exp(-e\Phi_b/kT)$, where e is charge elementary quantum; $\Phi_b$, a barrier height of the Shottky junction; and k, a Boltmann's constant. A temperature T corresponding to a predetermined output voltage Vo can be obtained.

On the other hand, there are many times in image sensors for visible light. A MOS type image sensor which is one of the image sensors is constituted such that each of pixels (photodiodes) arranged in a matrix is selected by longitudinal and lateral direction addresses and a signal corresponding to charges stored in the pixels is read out.

In addition, as an example of infrared image sensors, there has been the one using a bolometer as a thermal sensor, which is known by being disclosed in U.S. Pat. No. 5,021,663. The bolometer is an element changing its resistivity according to an increase or decrease (change) in temperature due to infrared-ray irradiation.

FIG. 3 shows a schematic constitution of an infrared image system disclosed in U.S. Pat. No. 5,021,663. In the constitution of FIG. 3, infrared irradiation from a warm human body 116 is incident on a bolometer array 106 via an infrared lens system 102 and a chopper 104. The bolometer array 106 is scanned by a driving and reading out electronic device 108 whereby a signal corresponding to an infrared-ray image of the warm human body 116. The signal is converted into an appropriate signal form, and then is displayed by a display 112.

FIG. 4 shows a constitution of the bolometer array 106 in the infrared-ray image system of FIG. 3, and FIG. 5 shows a sectional view of a constitution of one pixel in the bolometer array 106. As is described referring to FIG. 3, an infrared-ray image of a subject 116 such as a warm human body is formed on the bolometer array 106 via the infrared-ray lens system 102 and the chopper 104. In the bolometer 106, as shown in FIG. 4, infrared-ray of the incident infrared-ray image is irradiated onto a bolometer resistor $R_B$ of the pixel 140 and a temperature of this bolometer resistor $R_B$ changes, whereby the resistivity of the bolometer resistor $R_B$ changes. Thus, a voltage changes, which is obtained from a connection node of the bolometer resistor $R_B$ and a fixed resistor $R_L$ connected in series between a bias voltage terminal (V) 182 and a ground terminal. This voltage change is fetched from a row reading out circuit 128 into the outside via a capacitor 122, an amplifier 120, and a switch 132 and then is supplied to the driving and reading out electronic device 108 of FIG. 3.

Furthermore, as another example of the infrared-ray image sensor using the bolometer as the thermal sensor, there has been the one disclosed in Japanese Patent Application Laid Open No. Heisei 8-105794. In this infrared-ray image sensor, charges discharged with a current via the bolometer is supplied from a capacitor element arranged outside the infrared-ray image sensor. Then, a temperature at a position where each of the bolometers is arranged, that is, an incident amount of the infrared-ray is obtained, based on an amount of a voltage change between the capacitor elements accompanied with discharge amount from the capacitor element for a predetermined period of time upon selection of each of the bolometer.

SUMMARY OF THE INVENTION

The object of the present invention is to provide an infrared-ray image sensor which is capable of detecting an output signal from a light receiving section composed of diodes and bolometers arranged in a matrix, the signal being according to a temperature of the light receiving section, and is capable of obtaining an infrared-ray image.

A thermal type infrared-ray image sensor of the first aspect of the present invention comprises (a) a light receiving section which includes Shottky barrier diodes with capacitance arranged in a matrix defined in first and second directions, each of the Shottky barrier diodes having a first terminal set to be a reference potential lebel and changing a value of a reverse current flowing therethrough according to a change in temperature due to infrared-ray irradiation; (b) a conduction selection section which connects electrically a second terminal of each of the Shottky barrier diodes to a common terminal alternatively, responding to a selection signal as to the first direction and a selection signal as to the second direction; (c) a reverse bias application section which is connected to the common terminal, applies a reverse bias voltage to the selected Shottky barrier diode, charges the capacitor of the selected Shottky barrier diode, and generates a voltage signal at the common terminal according to a value of a reverse current flowing through the selected Shottky barrier diode; and (d) a scanning section which sequentially selects the Shottky barrier diodes, and issues a conduction indication signal for instructing a conduction of the second terminal of each of the Shottky barrier diodes and the common terminal for a predetermined period of time.

In the thermal type infrared-ray image sensor of the first aspect of the present invention, the predetermined Shottky barrier diodes of the light receiving section and a common terminal for providing a signal corresponding to charges stored therein are connected electrically by the conduction selection section controlled by the scanning section for a predetermine period of time every predetermined charging cycle, the Shottky barrier diodes being arranged at a predetermined pitch in the first and second directions, and the light receiving section is scanned. Therefore, a signal corresponding to a change in temperature of a reverse bias current of the Shottky barrier diode can be detected.

According to the thermal type infrared-ray image sensor of the first aspect of the present invention, a signal corresponding to a change in temperature of a reverse bias current of each of the Shottky barrier diodes arranged in a matrix can be detected. This makes it possible to use the Shottky diode as the light receiving section of the infrared-ray image sensor.

The infrared-ray image sensor of the first aspect of the present invention may further comprise a charge supply device which supplies charges to precharge the capacitance of each of the Shottky barrier diodes thereto; a precharge selection section which make a charge supply terminal of the charge supply device and second terminals of more than one of the selected Shottky barrier diodes conductive, according to a precharge selection signal; and a precharge control section which issues a precharge selection signal in synchronization with a selection signal as to a first direction and a selection signal as to a second direction.

In this case, the precharge control section controls operations of the charge supply device which applies a predetermined voltage to the Shottky barrier diode to charge a predetermined amount of charges therein and the precharge selection section which stores charges in the selected Shottky barrier diode. A predetermined amount of the charges are charged in the Shottky barrier diode before the charges stored in the Shottky barrier diode are output by a predetermined time. Therefore, the amount of the charges stored in the Shottky barrier diode for a predetermined period of time can be detected.

Consequently, the amount of the charges stored/discharged in/from the Shottky barrier diode for a predetermined period of time can be detected. Therefore, it will be possible to add a shutter function to utilize the storing time required for storing the charge in the Shottky barrier diode as a shutter time, and it will be possible to use the Shottky barrier diodes employing most of silicide as the light receiving section.

A thermal type infrared-ray image sensor of a second aspect of the present invention comprises (a) a light receiving section which includes diodes with stray capacitance arranged in a matrix defined in first and second directions, each of the diodes having a first terminal set to be a reference potential level and changing its current characteristic according to a change in temperature due to irradiation of infrared-ray thereto; (b) first switching elements of the same number as that of the diodes, each of which is arranged for corresponding one of the diodes and connects its first and second terminals into a conduction state responding to a conduction command signal composed of selection signals as to the third and second directions, and each of the first terminal being connected electrically to corresponding one of the diodes; (c) more than one capacitance element, each first terminal of the elements being connected electrically to corresponding one second terminal of the switching element, and the first terminal of any of the capacitance elements being connected electrically to the third terminal of the first switching element; (d) a conduction selecting section which brings the first terminal of each of the capacitance elements into an electrical conduction state with the common terminal, according to the conduction command signal; (e) a charge supplying section connected to the common terminal, which applies a voltage between the first and second terminals of the selected capacitance element to charge the selected capacitance element, and provides a voltage signal according to a discharge amount of the charges stored in the selected diode to the common terminal; and (f) a scanning section which selects sequentially the diodes one by one, instructs a switching of the first switching element corresponding to the selected diode, and issues a conduction command signal for instructing a conduction of the common terminal and the first terminal of the capacitance element corresponding to the selected diode for a predetermined period of time.

In the thermal type image sensor of the second aspect of the present invention, provided are a plurality of diodes producing an increase or decrese in temperature due to infrared-ray irradiation; a plurality of first switching elements, each being arranged for corresponding one diode and being connected to one terminal of corresponding one diode; and a capacitance element connected to other terminal of the first switching element. The first switching element is turned on and the charges stored in the capacitance element is discharged for a predetermined period of time, a signal according to residual charges of the capacitance element is output.

The diodes are at the temperature according to infrared-ray irradiated thereonto, and a current responding to the temperature flows therethrough so that the charges stored in the capacitance element is discharged. Therefore, by discharging the charges of the capacitance element through the diode for a predetermined period of time, the amount of the discharged charges, that is, the amount of the residual charges changes according to the temperature of the diode. As a result, by providing a signal according to the amount of the residual charges in the capacitance element, a signal according to the irradiated infrared-ray can be obtained. As described above, since the thermal type infrared-ray image sensor of the second aspect of the present invention is constituted such that the charges is discharged from the capacitance element through the diode, a current flowing at the time of discharging can be made large and the maximum changing amount of the charges can be increased, resulting in reducing the minimum temperature resolution or noise equivalent temperature difference (NETD).

Moreover, it is preferable that precharge means is provided to precharge each of the diodes such that the diodes are biased in a forward direction when each of the switching elements connected to corresponding one of the diodes is rendered to be conductive. Since such precharge means biases the diode in a forward direction, the charges in charge storing means can be discharged by turning on the first switching element to flow a forward direction current of the diode. Therefore, the amount of the charge discharged by the diode can be increased and the minimum temperature resolution or noise equivalent temperature difference can be greatly reduced.

In the thermal type infrared-ray image sensor of the second aspect of the present invention, the image sensor may comprises a plurality of diodes arranged in a matrix in first and second directions, each increasing its temperature by infrared-ray irradiation; a plurality of first switching elements, each being arranged every position in a first direction, each corresponding to one of the diodes and having one terminal connected to corresponding one of the diodes; a plurality of wirings in a second direction, to which the other terminals of the first switching elements are commonly connected, the switching elements being corresponding to the diodes arranged every position in the first direction; and capacitance elements arranged every line in the second direction, each element being connected to corresponding one of the lines in the second direction.

In such thermal type infrared-ray image sensor, the switching element connected to the diode is turned on every first direction whereby the charges in the storing capacitor corresponding to the line in the second direction are discharged via the line in the second direction and the diode for a predetermined period of time. Thereafter, a signal according to the residual charges in the storing capacitor as to the second direction is sequentially output. One reading-out operation as to the first direction is performed. Similarly, reading-out of the positions in the first direction can be sequentially performed. Thus, an image signal corresponding to an image provided by infrared-ray irradiation onto such as human body can be obtained.

In this case, the capacitance elements may be constituted individually by separate capacitance parts every wiring in the second direction. However, they may be constituted by arranging parasitic capacitances of the wirings in the second direction. In this case, the device structure can be simplified, resulting in removing necessity for providing a space for the capacitance elements on the integrated circuit.

Moreover, the diodes may be a diode formed of an ordinary semiconductor PN junction, however, they may be also a Shottky barrier diode. In a case of the Shottky barrier diode, since a diffusion depth can be made thinner than the PN junction diode, a thickness of each of the pixels can be reduced and thermal capacitance can be reduced thereby enhancing sensitivity.

Furthermore, it is preferable that precharge means for precharging the capacitance element is provided such that each of the diodes is biased in a forward direction when the switching element connected to each of the diodes is rendered to be conductive. In this case, since the charges in the capacitance element can be discharged with the forward direction current flowing through the diode, as described above, it is possible to enhance easily the minimum temperature resolution (NETD) of the thermal type infrared-ray image sensor.

Furthermore, the thermal type infrared-ray image sensor may be constituted such that a second switching element is connected between each of the wirings in the second direction and the common terminal and an output signal is obtained based on a charging current flowing through the capacitance element from the common terminal when the second switching element is rendered to be conductive. In this case, the charging current flowing into the capacitance element from the common terminal becomes larger as the residual charges becomes smaller, when the second switching element is rendered to be conductive. Therefore, the charging current flowing into the capacitance element becomes a signal which changes according to the amount of the residual charges, and it can be utilized as an output signal. The signal corresponding to the temperature in each of the diodes can be obtained.

The thermal type infrared-ray image sensor of the second aspect of the present invention may comprise a plurality of diodes arranged in a matrix along first and second directions; a plurality of first switching elements, each of which is arranged for corresponding one of the diodes and one terminal of which is connected to corresponding one of the diodes; a plurality of wiring in the second direction arranged every position in the second direction, to which the other terminal of each of the first switching elements corresponding to one of the diodes arranged in the same position as to the second direction is connected; capacitance elements, each of which is arranged for every wiring in the second direction and is connected to corresponding one of the wirings in the second direction; second switching elements, each of which is connected between corresponding one of the wirings in the second direction and the common terminal; a scanning section which turns on sequentially the first switching elements connected to the corresponding diodes arranged in the position in the first direction, and drives sequentially the second switching elements; and bias voltage supplying section for supplying a forward bias voltage between the other terminals of the diodes and the common terminal.

In such thermal type infrared-ray image sensor, the charges in the storing capacitance are discharged for a predetermined period of time by turning on the first switching element every position in the second direction, utilizing the forward direction current of the diode. Since the magnitude of the forward direction current flowing through the diode changes according to temperature of the diode, the amount of the residual charges in the capacitance element changes according to the temperature of the diode. Therefore, in this situation, the second switching elements are sequentially turned on, and the charging current is supplied to the capacitance elements of the corresponding wiring in the second direction. Then, a signal according to the magnitude of the charging current is provided, whereby a signal in accordance with a temperature distribution of the diodes can be obtained as an output signal. In such thermal type infrared-ray image sensor, since the charges in the charging capacitor are discharged utilizing the forward direction current of the diode, that is, since the comparatively large capacitance in the storing capacitor is discharged by the forward direction current of the diode which is comparatively large, it is possible to enhance the sensibility of the thermal type infrared-ray image sensor and to increase the minimum temperature resolution (NETD) so as to have a small value.

In this case, a first power source connected to other terminal of each of the diodes and a second power source connected to the common terminal via a load resistor should be preferably provided, and voltages of the first and second power sources should be preferably selected so as to precharge the storing capacitor such that the diode is biased in a forward direction when the first switching element connected to the diode is turned on. With such constitution, since the capacitance element can be previously charged so as to bias the diode in a forward direction when the switching element is turned on, it will be possible to discharge the charges in the storing capacitor with a forward direction current according to a temperature of the diode. Realization of the thermal type infrared-ray image sensor having an excellent performance with a simple circuit structure will be possible.

A thermal type infrared-ray image sensor of a third aspect of the present invention comprises (a) a light receiving section including bolometers arranged in a matrix defined in first and second directions, each of which changes its resistivity according to a change in temperature due to infrared-ray irradiation and has a first terminal set to be a reference potential level; (b) first switching elements of the same number as that of diodes, each of which is arranged for corresponding one of the bolometers and brings its first and second terminals into a conduction state according to a conduction command signal composed of selection signals as to the first and second directions supplied from the third terminal of the bolometer, each of the first switching elements being connected electrically to a first terminal of the corresponding one of the bolometers; (c) capacitance elements, each of which has a first terminal connected electrically to the second terminal of corresponding one of the switching elements and a second terminal set to be the reference potential, the second terminal of each of the first switching elements being connected electrically to any one of the capacitance elements; (d) a conduction selection section which connects electrically the first terminal of each of the capacitance elements to the common terminal selectively according to a conduction command signal; (e) a charge supply section connected to the common terminal, which applies a voltage between the first terminal of the selected capacitance element and its second terminal to charge the selected capacitance element, and supplies a voltage signal to the common terminal according to a discharge amount at the selected bolometer; and (f) a scanning section which selects sequentially the bolometers, instructs a switching operation of the first switching element according to the selected bolometer, and issues a conduction command signal for instructing the conduction of the first terminal of the capacitance element corresponding to the selected bolometer and the command terminal for a predetermined period of time.

In the thermal type infrared-ray image sensor of the third aspect of the present invention, after the first switching element is turned on and the charges in the capacitance element are discharged via the bolometer for a predetermined period of time, a signal according to the residual charges in the capacitance element is provided.

Specifically, as a method to detect the change of the resistivity of the bolometer, the current mode reading out mode is not used in which a constant voltage is applied to the resistor and the change in the resistivity is obtained from the change in the current as conventional, but the storing mode is used in which the charges stored in the capacitance element are discharged through the bolometer for a predetermined period of time and a signal according to the residual charges is obtained thereby obtaining the change in the resistivity. For this reason, it is possible to remove an influence due to a self-heat generation of the bolometer, thereby obtaining an infrared-ray image having little offset.

In this case, it is preferable that a second switching element having one terminal connected to the capacitance element, and a power source and a load, constituting a charge supply section, are provided, and a load resistor connected to a circuit between the second switching element and the power source is arranged, and an output signal is obtained based on an induction current flowing through the capacitance element via the load resistor.

In such constitution, after the charges in the capacitance element are discharged through the bolometer for a predetermined period of time, the second switching element is turned on, and the capacitance element is charged again from the power source through the load resistor. The magnitude of the charging current at recharging becomes larger as the residual charges in the capacitance element becomes Therefore, the voltage produced across the load resistor by this charging current is association with the amount of the residual charges in the capacitance element, so that it is associated with the resistivity of the bolometer. The voltage of the load resistor can be obtained by this fact, whereby the resistivity of the bolometer can be obtained. Thus, it will be possible to obtain accurately an infrared-ray image signal with a simple device constitution.

In the thermal type infrared-ray image sensor of the third aspect of the present invention, it is possible that provided are a plurality of bolometers arranged in a matrix along first and second directions, each producing an increase in its temperature due to infrared-ray irradiation; a plurality of capacitance elements, each being arranged for corresponding one of the bolometers; a plurality of first switching elements, each being connected between corresponding one of the bolometers and corresponding one of the capacitance elements; a plurality of wirings in the second direction arranged for every column; and a plurality of second switching elements connected between corresponding one of the capacitance elements and corresponding one of the wirings in the second direction.

In such thermal type infrared-ray image sensor, the first switching elements are turned on every row, and the charges in the capacitance elements are discharged through the corresponding bolometers for a predetermined period of time. Then, the second switching elements are turned on, the capacitance elements are charged through the wirings in the second direction, and signals according to the charging currents at the time of charging are provided sequentially through the wirings in the second direction.

With such operations, an image signal corresponding to the image due to the infrared-ray irradiation onto subjects such as a human body can be obtained by the bolometers arranged in a matrix. Also in this case, a self-heat generation is not almost produced. Therefore, it will be possible to obtain a high quality image with low power consumption.

In the thermal type infrared-ray image sensor of the third aspect of the present invention, it is possible that provided are a plurality of bolometers arranged in a matrix along first and second directions, each producing an increase in its temperature due to infrared-ray irradiation; a plurality of first switching elements, each being arranged for corresponding one of the bolometers and each having one terminal connected to corresponding bolometer; a plurality of wirings in the second direction arranged for every position in the first direction, the other terminal of each first switching elements corresponding to one of the bolometers being connected thereto; and a plurality of capacitance elements, each being arranged for corresponding one of the wirings in the second direction and being connected to corresponding one of the wirings in the second direction.

In such thermal type infrared-ray image sensor, the switching elements at the same position in the first direction are sequentially, the charges in the capacitance elements arranged for every wiring in the second direction are discharged through the bolometers for a predetermined period of time. Thereafter, the capacitance elements are charged through the wirings in the second direction, and then signals according to the residual charges in the capacitance elements are sequentially provided through the wiring in the second direction.

Also in this case, an image signal corresponding to the image due to infrared-ray irradiation onto subjects such as a human body can be obtained with a high quality without producing adverse affections due to a self-heat generation. In addition, it suffices that the storing capacitances may be only formed every wiring in the second direction, so that the device constitution is simplified and occupied areas by the storing capacitances on the integrated circuit substrate can be reduced. Thus, a high density mounting will be possible.

In this case, individual capacitance elements may be individually arranged for every wiring in the second direction as the capacitance elements. However, as another arrangement, at least some of the capacitance elements may be constituted of a parasitic capacitance induced in the wiring in the second direction. In this case, the device constitution can be simplified, and necessity for providing a space for the storing capacitance on the integrated circuit substrate is removed, or, the space can be reduced.

In the thermal type infrared-ray image sensor of the third aspect of the present invention, it is possible that provided are a plurality of bolometers arranged in a matrix along first and second directions, each producing an increase in its temperature due to an infrared-ray irradiation; a plurality of capacitance elements, each being arranged for corresponding one of the bolometers; a plurality of first switching elements, each being connected between corresponding one of the bolometers and corresponding one of the capacitance elements; a plurality of third switching elements, each having one terminal connected to a connection node between corresponding one of the capacitance elements and corresponding one of the capacitance electrodes; a plurality of wirings in the second direction arranged for every position in the first direction, other terminal of each of the third switching elements arranged corresponding to the bolometers which are arranged for every position in the first direction being connected thereto; second switching elements connected between each of the wirings in the second directions and a common terminal; a scanning circuit which turns on the first and third switching elements sequentially every the row in a predetermined sequence, and drives the second switching elements sequentially; and voltage supply means for supplying a bias voltage between other terminals of the capacitance elements and the common terminal through a load resistor.

In such thermal type infrared-ray image sensor, the first switching elements are sequentially turned on every position in the second direction, and the charges in the capacitance elements are discharged through corresponding bolometers for a predetermined period of time. Thereafter, the third and second switching elements are turned on sequentially whereby the charging current is supplied to each of the capacitance elements through the load resistor, and a signal according to the magnitude of the charging current is provided.

Also with such constitution, an image signal corresponding to a two-dimensional image obtained by infrared-ray irradiation onto such as a human body can be obtained, and, in addition, the image signal is never off-set by a self-heat generation of the bolometer. Thus, an image with a high quality and fidelity can be obtained.

The thermal type infrared-ray image sensor of the third aspect of the present invention comprises a plurality of bolometers arranged in a matrix along first and second directions, each producing an increase in its temperature due to infrared-ray irradiation; a plurality of first switching elements, each being arranged for corresponding one of the bolometers and having one terminal connected to one terminal of corresponding one of the bolometers; a plurality of wirings in the second direction arranged for positions in the first direction, other terminal of each of the first switching elements corresponding to the bolometers arranged for every column being connected thereto; capacitance elements arranged for every wiring in the second direction and connected to corresponding wirings in the second direction; second switching elements, each being connected between corresponding one of the wirings in the second direction and a common terminal; a scanning circuit which turns on sequentially, every column, the switching elements connected to the bolometers arranged every position in the second direction, and drives sequentially the second switching elements; and charge supply means for supplying a bias voltage between the other terminal of each of the bolometers and a common terminal through a load resistor.

In such thermal type infrared-ray image sensor, the first switching elements are sequentially turned on every row, and the charges in the capacitance elements arranged every wiring in the second direction are discharged through the bolometers for a predetermined period of time. Thereafter, the second switching elements are turned on sequentially and the charging current is supplied to the position in the first direction through the load resistor. Thus, a signal according to the magnitude of the charging current is provided.

In this case, since it suffices that the storing capacitance may be only arranged every vertical line, an area occupied by the capacitance elements on the integrated circuit substrate can be reduced so that an image sensor with a high integration can be obtained.

Furthermore, also in this case, at least some of the capacitance elements may be constituted by parasitic capacitances of the wirings in the second direction, an occupied area of the charge storing capacitances on the integrated circuit substrate can be reduced or removed. Thus, it is possible to obtain a high density mounting.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 13 is a drawing showing a Shottky barrier height of various kinds of silicide;

DESCRIPTION OF THE PREFERRED EMBODIMENTS (First Embodiment)

Figure 6:
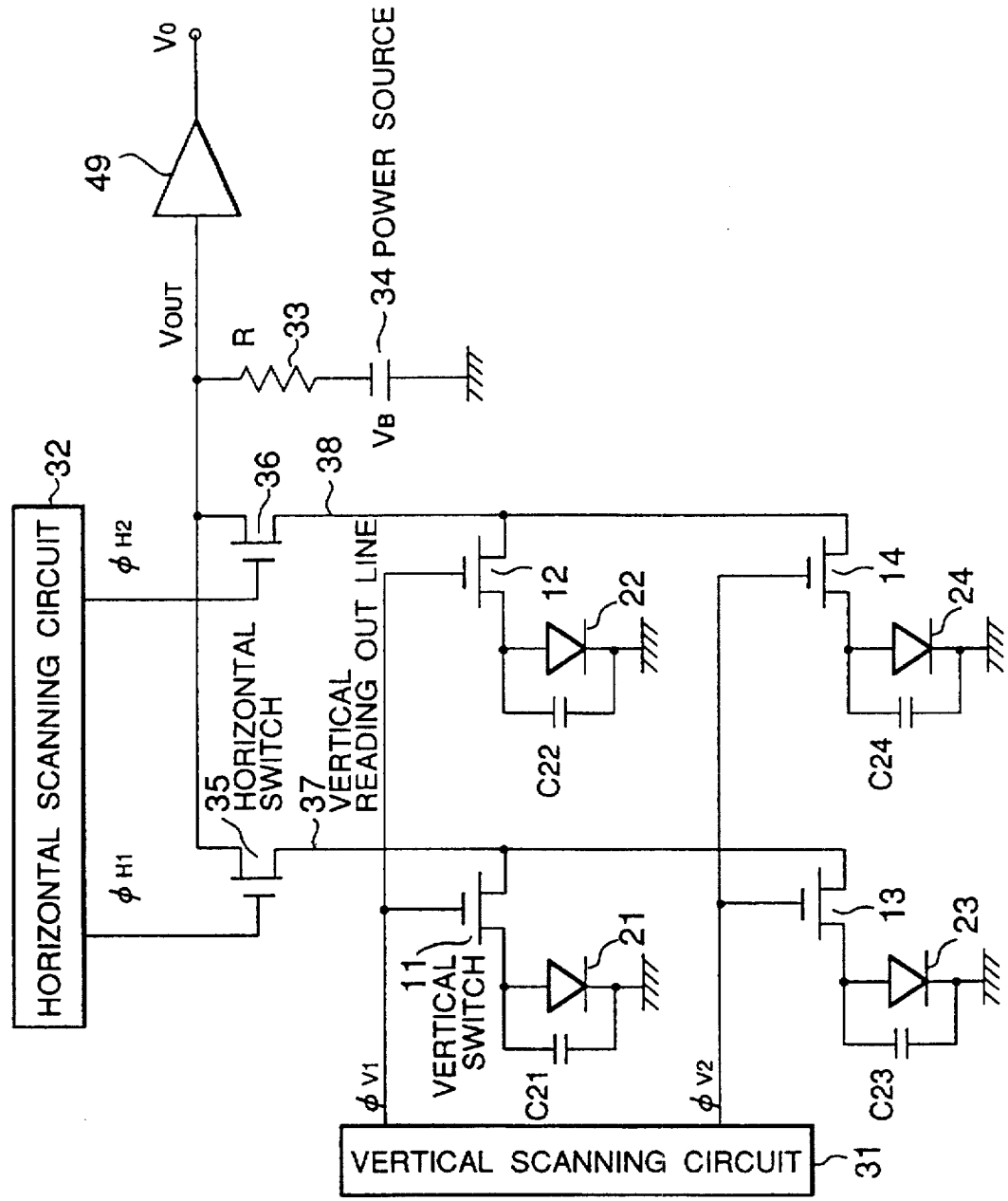
FIG. 6 is a constitution diagram of an infrared-ray image sensor of a first embodiment of the present invention.

FIG. 6 is a circuit diagram showing a constitution of a first embodiment of a thermal type infrared-ray image sensor of the present invention. There have been hundreds of p-n junction diodes constituting a conventional MOS type image sensor in horizontal and vertical directions. Since each of these p-n junction diodes constitute a pixel (a light receiving section) of the MOS type image sensor, hundreds of Shottky barrier diodes are needed in the thermal type infrared-ray image sensor respectively in the horizontal and vertical directions. However, for the simplicity of description, an example is shown where two Shottky barrier diodes are arranged in the horizontal direction and two Shottky barrier directions are arranged in the vertical direction. One Shottky barrier diode is for one pixel. Specifically, four Shottky barrier diodes 21 to 24 are arranged in a matrix. Parasitic capacitances C21 to C24 are accompanied with the Shottky barrier diodes 21 to 24.

A drain of a reading out p-type MOS type transistor (a vertical switch) 11 is connected to the Shottky barrier diode 21. A gate of the vertical switch 11 is connected to a vertical scanning circuit 31, and a source of the vertical switch 11 is connected to a vertical reading out line 37. In addition, a drain of the vertical switch 12 is connected to the Shottky barrier diode 22, and a gate of the Shottky barrier diode 12 is connected to a vertical scanning circuit 31. A source of the vertical switch 12 is connected to a vertical reading out line 38.

Furthermore, a drain of a vertical 13 is connected to a Shottky barrier diode 23, and a gate of the vertical switch 13 is connected to the vertical scanning circuit 31. A source of the vertical switch 13 is connected to a vertical reading out line 37. In addition, a drain of a vertical switch 14 is connected to the Shottky barrier diode 24, and a gate of the vertical switch 14 is connected to the vertical scanning circuit 31. A source of the vertical switch 14 is connected to the vertical reading out line 38.

A drain of a horizontal output p-type MOS transistor (a horizontal switch) 35 is connected to an upper end of the vertical reading out line 37, a gate of which is connected to a horizontal scanning circuit 32. A source of the horizontal switch 35 is connected to a common terminal 39. In addition, a drain of a horizontal switch 36 is connected to an upper end of the vertical reading out line 38, a gate of which is connected to the horizontal scanning circuit 32. A source of the horizontal switch 36 is connected to the common terminal 39.

The vertical and horizontal scanning circuits 32 and 31 are composed of such as shift registers, respectively, and are driven with clock pulses and a start pulse. The horizontal scanning circuit 32 generates driving pulses $\Phi_{H1}$ and $\Phi_{H2}$, and provides them. The vertical scanning circuit 31 generates driving pulses $\Phi_{V1}$ and $\Phi_{V2}$, and provides them.

The driving pulses $\Phi_{H1}$ and $\Phi_{H2}$ provided from the horizontal scanning circuit 32 are supplied to the horizontal switches 35 and 36, respectively, and operation timings of them are controlled. The driving pulses $\Phi_{V1}$ and $\Phi_{V2}$ provided from the vertical scanning circuit 31 are supplied to the gates of the vertical switches 11 to 14, respectively, and operation timings of them are controlled. Thus, each of the Shottky barrier diodes 21 to 24 and the output terminal 39 are conducted at a predetermined timing, the output terminal 39 being connected to a power source 34 through a resistor 33.

The infrared-ray image sensor of the first embodiment of the present invention is such designed that a reverse current generated at each of the Shottky barrier diodes 21 to 24 of the light receiving section is not read out immediately and the discharge amount of the charges for a constant period of time is read out. This is called "a integration mode". By employing this integration mode, to enhance the detection sensitivity of Shottky barrier diode (hereinafter referred to as a SBT), even when a Shottky barrier height $\Phi b$ is set at high, that is, the value of the reverse current Is is reduced, the discharged charge is integrated, so that it is possible to detect the value used for temperature measurement (an electrical signal) with certainty. Therefore, performance of the SBT can be utilized effectively.

By the way, in an ordinary image sensor, a frame rate shall be 1/30 sec. Therefore, the storing time of the signal charges in the SBT must be set to be shorter than 1/30 sec.

However, to enhance the detection sensitivity of the SBT, when the Shottky barrier height $\Phi b$ is set to be large, the discharging time in the SBT is long unfortunately so that the Shottky barrier height $\Phi b$ can not be made high without limitation.

Specifically, to utilize the SBT performance to the utmost limit, it is desirable that the Shottky barrier height $\Phi b$ is set to be high, that is, the detection sensitivity is enhanced, keeping the discharging time of the charge at the SBT near 1/30 sec (not more than 1/30 sec).

The Shottky barrier height $\Phi b$, i.e., a barrier height of the Shottky barrier junction induced at an interface between a semiconductor substrate and a metal silicide layer, is determined by a material of the metal silicide, impurities near an interface between a silicon and the metal silicide, and a concentration of the impurities. Furthermore, according to the recent studies, it has been reported that the foregoing Shottky barrier height $\Phi b$ is also influenced by a surface orientation (a surface orientation of a silicon crystal) of silicon where the metal silicide layer is formed. Here, a constitution example of the infrared-ray image sensor is shown below, when considering the above-described circumstances.

Figure 7:
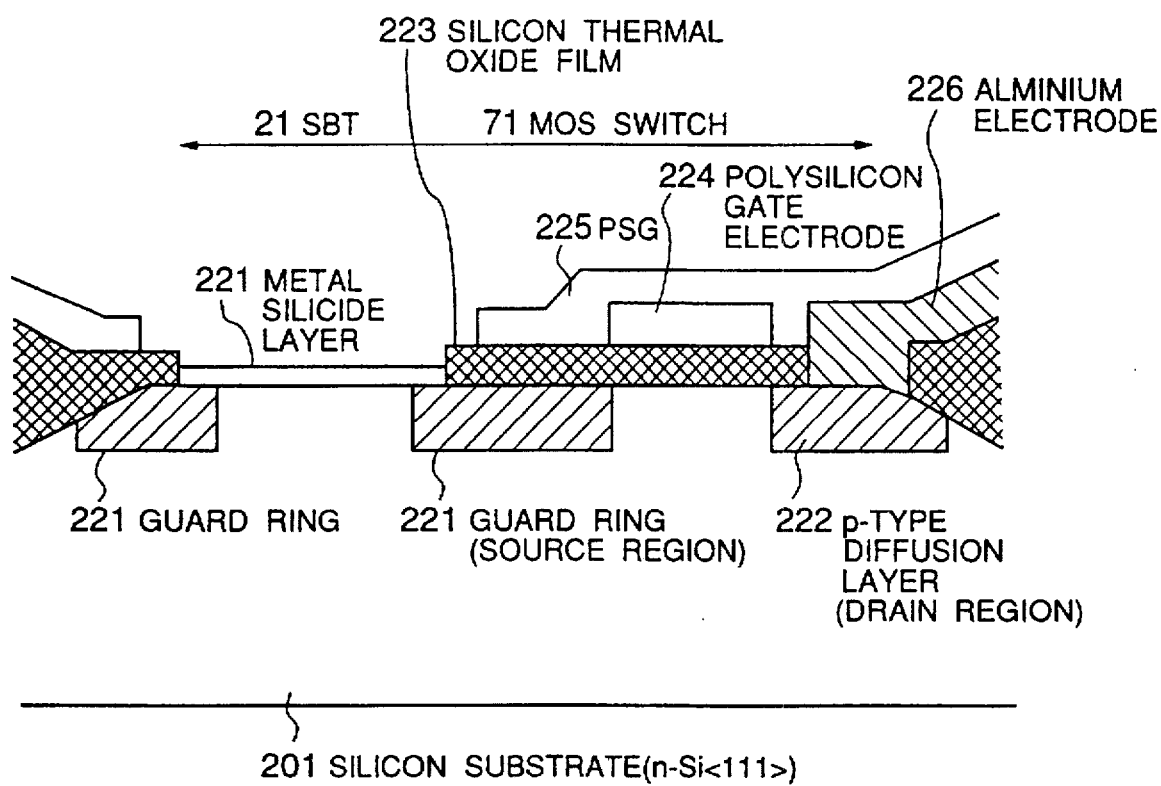
FIG. 7 is a sectional view showing a first example of a constitution of one pixel of the infrared-ray image sensor of FIG. 6.

FIG. 7 is a sectional view showing a constitution example of one pixel, which corresponds to the SBT 21, in the infrared-ray image sensor shown in FIG. 6. In the infrared-ray image sensor of the first embodiment, an n-type silicon is used for a silicon substrate 201, a surface orientation of an element formation surface (a formation surface of a metal silicide layer 211) of the substrate 201 being <111> surface. In the SBT 21, the metal silicide layer 211 is formed on an upper surface of the silicon substrate 201. In this embodiment, the metal silicide layer 211 is a platinum silicide layer. A donut-shaped guard ring 221 (p-type region) is formed in a peripheral portion at the bottom of the metal silicide layer 211, the guard ring 221 serving also as a source region of an MOS switch 11.

On the other hand, in the MOS switch 11 formed adjacent to the SBT 21, a silicon thermal oxide film 223 is formed on the upper surface of the silicon substrate 1. A polysilicon gate electrode 224 (a gate region of the MOS switch 11) is formed on the upper surface of the silicon thermal oxide film 223. As described above, the guard ring 221 is formed on the lower surface of the silicon thermal oxide film 223 (in the silicon substrate 201), the guard ring 221 serving also as the source region of the MOS switch 11. A p-type diffusion layer 222 (a drain region of the MOS switch 11) is formed at the position facing the guard ring 21. The p-type region is not formed at the position corresponding to the position where the polysilicon gate electrode 224, which is located at the lower surface of the silicon thermal oxide film 223. The n-type silicon substrate 201 is formed. Furthermore, a portion of the p-type diffusion layer 222 which is the drain region of the MOS switch 11 is contacted with an alminium electrode 226.

In addition, a phosphorus doped silicon oxide film (hereinafter referred to as a PSG) 225 is formed on the upper surface of the MOS switch 11.

Next, a reading out operation of a signal charge of the infrared-ray image sensor of this embodiment will be described. The description is made for one pixel.

First, in an initial state, a signal voltage at low level is being applied to the polysilicon gate electrode 224 (the gate of the MOS switch 11), so that the MOS switch 11 is kept at a turn off state. It should be noted that initial charges are charged in the SBT 21 and the source region of the MOS switch 11 (the guard ring 21) at the initial state.

When a voltage of i.e., +5V is applied to an $n^+$-type diffusion layer (not shown) in the silicon substrate 201, that is, when a reverse direction bias is applied to the SBT 21, a reverse current according to the Shottky barrier height of the SBT 21 flows exceeding a depletion layer (inside the guard ring 221 formed on the lower surface of the metal silicide layer 21). The charges stored in the SBT 10 and the source region (the guard ring) of the MOS switch 20 are discharged according to the infrared-ray received. This reverse current flows until the voltage due to the charges stored in the SBT 21 and the source region of the MOS switch 11 (the guard ring 221) is reduced to zero. When this voltage becomes zero, no reverse current flows. Here, a state that no reverse current flows is called "a saturation state", and a period of time from beginning of the flow of the reverse current to the saturation state shall be a saturation time. In the infrared-ray image sensor of this embodiment, half of the saturation time shall be a storing time for the signal charge per one pixel.

Then, a voltage signal at high in level is applied to the gate of the MOS switch 11 (the polysilicon gate electrode 224), so that the MOS switch 11 is turned on. Thus, the charges, which is the difference between the initial charges and the residual charges stored in the SBT 21 and the source of the MOS switch 11 (the guard ring 221), flows into the drain region (the p-type diffusion layer 222) through the alminium electrode 26.

After the storing of the charges is completed, the MOS switch 11 is turned off, discharging is repeated again.

In the infrared-ray image sensor of this embodiment, as described above, the metal silicide 211 is formed of the platinum silicide layer, and the n-type silicon is formed on the silicon substrate 201, the n-type silicon having the surface orientation <111> at the surface where the metal silicide layer 211 is formed. When the silicon substrate 201 and the metal silicide layer 211 are formed of the above-described materials, the above-described saturation time (the saturation time per one pixel) shall be 60 msec at an element temperature 25° C. Specifically, a discharging time of the initial storing charges of one pixel in the infrared-ray image sensor of this embodiment shall be 30 msec, which is a half of 60 msec.

The discharging time 30 msec is well in accordance with a time per one frame: 1/30 sec (about 33 msec) (a reading out time of a solid image pickup device) in an ordinary video output method. In addition, a B constant of this SBT is 9400, it is larger than a B constant 7900 of the BST formed of MoSi2/n-Si of a surface orientation <100>. Therefore, in this embodiment, infrared-ray detection sensitivity of the SBT can be enhanced to the maximum within a range where the discharging time does not exceed 1/30 sec.

Furthermore, the discharging time (30 msec) is well in accordance with an ordinary signal reading out cycle (1/30 sec). Therefore, it is not necessary to provide an additional signal processing circuit for signal reading out, whereby a miniaturization of the device will be possible as well as a control of manufacturing cost. Furthermore, it will be possible to suppress power consumption.

Figures 8, 9:
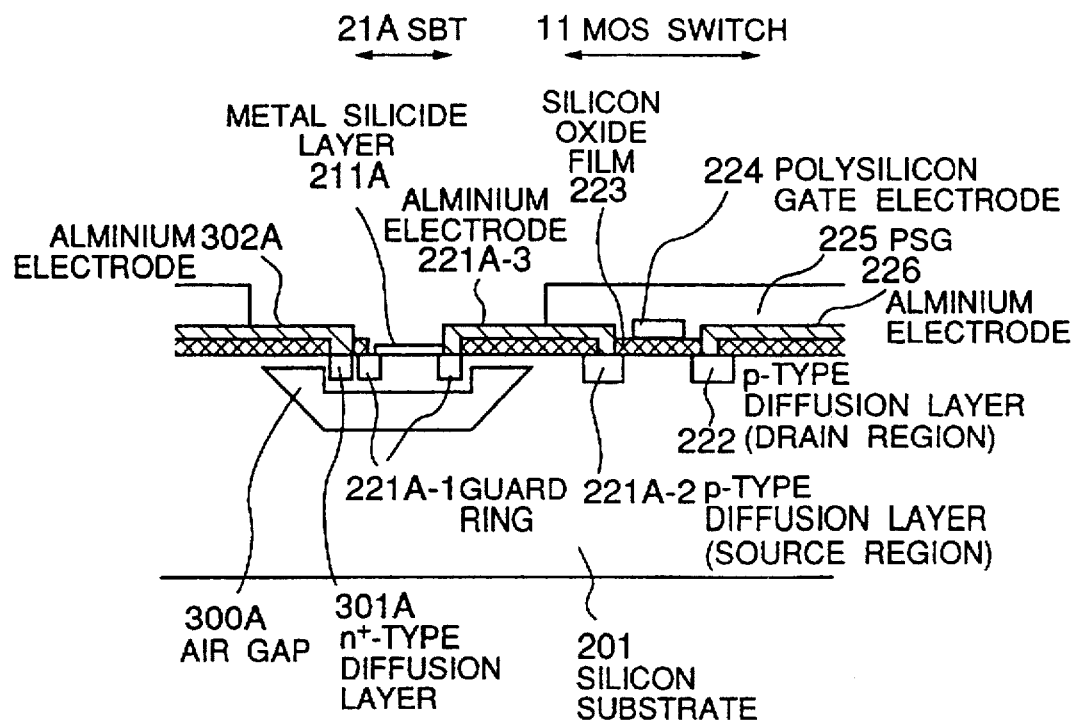
FIG. 8 is a diagram showing a relationship between formation materials and an operation characteristic, in the Shottky barrier diode of the infrared-ray image sensor of FIG. 7.
FIG. 9 is a sectional view showing a second example of a constitution of one pixel of the infrared-ray image sensor of FIG. 6.

FIG. 8 is a table showing a relationship between the discharging time, the B constant, and the Shottky barrier height of the BST, in the BST materials (the materials of the silicon substrate 201 and the metal silicide layer 211). As is clear from FIG. 8, this embodiment is proved to be most effective from a viewpoint of the storing time of the signal charges and the B constant (a level of the detection sensitivity), where the n-type silicon of the crystal surface orientation <111> of the element formation surface is used as the silicon substrate 201 and platinum is used as the metal silicide layer 211.

In addition, each of the silicon substrate 201 and the metal silicide layer 211 may be formed by different materials from those of this embodiment.

Specifically, in the event that the SBT 21 is formed using the n-type silicon of the crystal surface orientation <111> of the element formation surface as the silicon substrate 201 and nickel as the metal silicide layer 211, as shown in FIG. 8, the discharging time shall be 20 msec. Therefore, also in this case, the discharging time of the SBT 21 is not more than 1/30 sec, which is an ordinary frame rate, and it shall be comparatively close to 1/30 sec. The B constant (=8900) is large comparatively, that is, the detection sensitivity is elevated.

In addition, as shown in FIG. 8, in order to utilize the performance of the SBT comparatively effectively, it is estimated that the Shottky barrier height $\Phi$ should be set at about 0.75 to 0.80 eV.

Furthermore, the infrared-ray image sensor of this embodiment of the present invention is not limited to the constitution shown in FIG. 7, and other constitutions may be employed. For example, in order to elevate the detection sensitivity of the infrared-ray light receiving section (SBT), even when the infrared-ray light receiving section (SBT) is formed in a heat insulating structure to elevate the detection sensitivity, that is, when small thermal capacitance of the infrared-ray light receiving section is used to elevate the detection sensitivity, the present invention may be applied.

FIG. 9 is a sectional view showing a constitution of another embodiment of the present inventing. The constitution of the infrared-ray image sensor of this embodiment is similar principally to that of the infrared-ray image sensor shown in FIG. 7. However, the SBT 21 A (the infrared-ray light receiving section) possesses a diaphram structure.

Specifically, in the infrared-ray image sensor of this embodiment, the silicon substrate 201A is formed of an n-type silicon having a crystal surface orientation <111> as an element formation surface, and the SBT 21A and the MOS switch 11A are formed at positions away from each other. In this SBT 21A, the metal silicide layer 211A made of platinum silicide is formed on the upper surface of the silicon substrate 201A. The guard ring 221A-1 is formed (a p-type region) in the periphery at the bottom of the metal silicide layer 211A.

Furthermore, approximately a trapezoid-shaped air gap (a space) 300A is formed under the guard ring 221A-1, and the SBT 21A and the MOS switch 11 are separated by the air gap 300A.

In addition, an $n^+$-type diffusion layer 301A to apply a reverse bias to this SBT 21A is formed outside the guard ring 211A-1, and an alminium electrode 302A is formed on the $n^+$-type diffusion layer 301A.

It should be noted that although the MOS switch 11 of this embodiment is formed approximately in the same manner as the case shown in FIG. 7, a p-type diffusion layer 221A-2 serving as the source region is formed separating from the guard ring 221A-1. Specifically, the guard ring 221A-1 of the SBT 21A does not serve also as the source region of the MOS switch 11. This p-type diffusion layer 221A-2 and the guard ring 221A-1 are connected through an alminium electrode 221A-3.

Next, a reading out operation of the infrared-ray image sensor shown in FIG. 9 will be described. The operation of this infrared-ray image sensor is approximately the same as that shown in FIG. 7.

Specifically, in the initial state, a signal voltage at low in level is being applied to the polysilicon gate electrode 224, and the MOS switch 11 is kept at a turning off state. Thus, the SBT 21A and the source region (the p-type diffusion layer 221A-2) of the MOS switch 11 shall be previously charged with initial charges.

When the initial charges stored allows the $n^+$-type diffusion layer 301A to be applied with a voltage of about +5V through the alminium electrode 302A, specifically, when a reverse direction bias is applied to the SBT 21A, a reverse current according to a Shottky barrier height of the SBT 21A flows exceeding a depletion layer, which is formed inside of the guard ring 221A, i.e., under the metal silicide layer 211A, and the charges stored in the source region (the p-type diffusion layer 221A-2) of the MOS switch 11 and the SBT 21A are discharged.

This reverse current disappears when the voltage at the SBT 21 and the source region (the p-type diffusion layer 221A-2) of the MOS switch 11 becomes 0V, that is, a saturation state is produced. In addition, a storing time of the signal charges in this embodiment is equal to be a half of the saturation time (a time ranging from beginning of discharging the charges to the saturation state), similar to the embodiment shown in FIG. 7.

Then, when a signal voltage at high in level is applied to the gate region (the polysilicon gate electrode 24) of the MOS switch 11, the MOS switch 11 turns on. Thus, the charges stored in the SBT 21A and the source region (the p-type diffusion layer 221A-2) of the MOS switch 11, which is the difference between the initial charges and the residual charges, flow into the drain region (the p-type diffusion layer 222) through the alminium electrode 226.

Also in the infrared-ray image sensor of this embodiment, since the n-type silicon having a crystal surface orientation <111> as an element formation surface is employed as the silicon substrate 201A and a platinum silicide layer is employed as the metal silicide layer 211A, the discharging time is 30 msec, similar to the embodiment shown in FIG. 7. In addition, in this embodiment, since the infrared-ray light receiving section (the SBT 21A) possesses a heat insulating structure, the infrared-ray detection sensitivity is further elevated.

Figure 10:
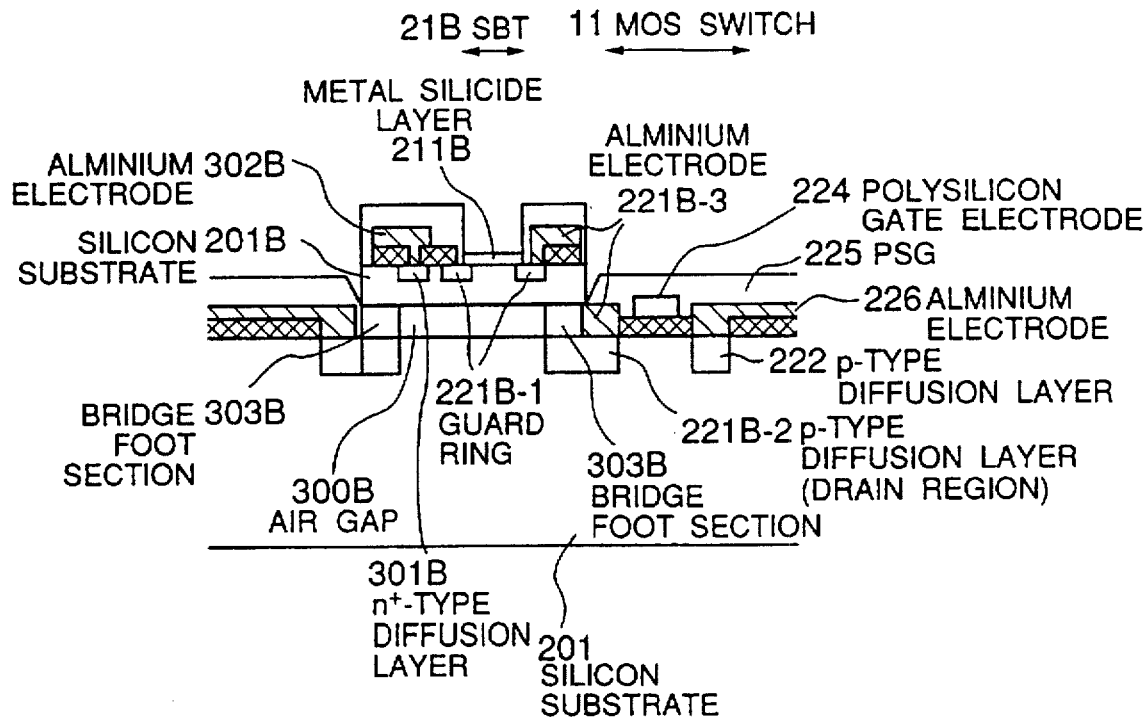
FIG. 10 is a sectional view showing a third example of a constitution of one pixel of the infrared-ray image sensor of FIG. 6.

FIG. 10 is a sectional view showing another constitution. The constitution of the infrared-ray image sensor of this embodiment is principally the same as that of the infrared-ray image sensor shown in FIG. 7, except that an SBT 21B possesses an air bridge structure.

Specifically, the SBT 21B of the infrared-ray image sensor of this embodiment is formed on a different silicon substrate 201B from the silicon substrate 201 where the MOS switch 11 is formed. It should be noted that an n-type silicon having a crystal surface orientation <111> as an element formation surface as the silicon substrates 201 and 201B.

The silicon substrate 201B on which the SBT 21 is formed is supported at its both ends by bridge leg sections 303B. The bridge leg sections 303B are fixed onto the silicon substrate 201. An air gap (a space) 100B is provided between the silicon substrates 201B and 201 (between the bridge leg sections 303B). In this SBT 21B, a metal silicide layer 211B formed of platinum silicide is formed on the upper surface of the silicon substrate 201B. A guard ring 221B-1 (a p-type region) is formed at the periphery of the metal silicide layer 211B and under the layer 211B.

Moreover, an n⁺-type diffusion layer 301B to apply a reverse direction bias to the SBT 21B is formed outside the guard ring 221B-1, and an alminium electrode 302B is connected to the diffusion layer 301B.

The p-type diffusion layer 221B-2 serving as the source region of the MOS switch 11 is formed independently from the guard ring 221B-1 unlike the case shown in FIG. 7, and both of the p-type diffusion layer 221B-2 and the guard ring 221B-1 are connected through an alminium electrode 221B-3. Next, an operation of the infrared-ray image sensor shown in FIG. 10 will be described. The operation of the infrared-ray image sensor of this embodiment is approximately the same as that of FIG. 7.

Specifically, in an initial state, a signal voltage at low in level is being applied to the polysilicon gate electrode 224, so that the MOS switch 11 is kept at a turning off state. At this time, the SBT 21B and the p-type diffusion layer 221B-2 (the source region of the MOS switch 20) are in states that initial charges are stored therein.

The storing of the initial charges allows the n⁺-type diffusion layer 301B to be applied with a voltage of about +5V through the alminium electrode 302B. Specifically, the SBT 21B is reversely biased. At this time, a reverse current in accordance with the Shottky barrier height of the SBT 21B exceeding a depletion layer, which is produced under the metal silicide layer 211B, i.e., inside the guard ring 21B-1, the charges are discharged from the SBT 10B and the source region (the p-type diffusion layer 21B-2) of the MOS switch 20.

This reverse current disappears when a voltage due to the charges stored in the SBT 21B and the source region (the p-type diffusion layer 221B-2) of the MOS switch 11 becomes 0 V. Specifically, a saturation state is produced. Moreover, the discharging time of the charges is a half of a saturation time, ranging from the beginning of charge discharging to the saturation state, similar to that of the embodiment shown in FIG. 7.

When a voltage signal at high in level is applied to the gate (the polysilicon gate electrode 224) of the MOS switch 11, the MOS switch 11 is turned on. Thus, the charges, which are equal to the difference between the initial charges and the residual charges stored in the SBT 21 and the source region (the p-type diffusion layer 221B-2) of the MOS switch 11, flow into the drain region (the p-type diffusion layer 222) through the alminium electrode 226.

Also in the infrared-ray image sensor of this embodiment, since the n-type silicon having the crystal surface orientation as the element formation surface is employed as the silicon substrate 201B and the platinum silicide layer is employed as the metal silicide layer 211B, the discharging time will be 30 msec, similar to the embodiment shown in FIG. 7. Moreover, in this embodiment, the infrared-ray light receiving section (the SBT 10B) possesses a heat insulating structure, so that infrared-ray detection sensitivity is further elevated.

Figure 11:
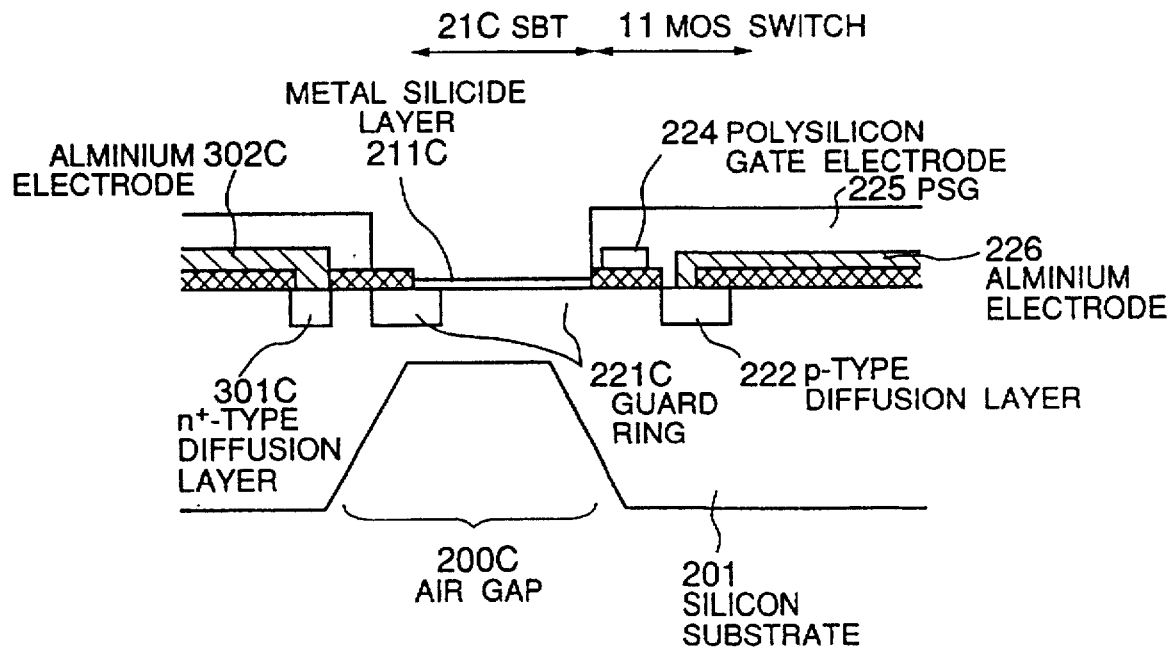
FIG. 11 is a sectional view showing a fourth example of a constitution of one pixel of the infrared-ray image sensor of FIG. 6.

FIG. 11 is a sectional view showing further another constitution. The constitution of the infrared-ray image sensor of this embodiment is principally the same as that of the infrared-ray image sensor shown in FIG. 7, except that a constitution of a SBT 21C is somewhat different from that of the SBT 21B.

Figure 1:
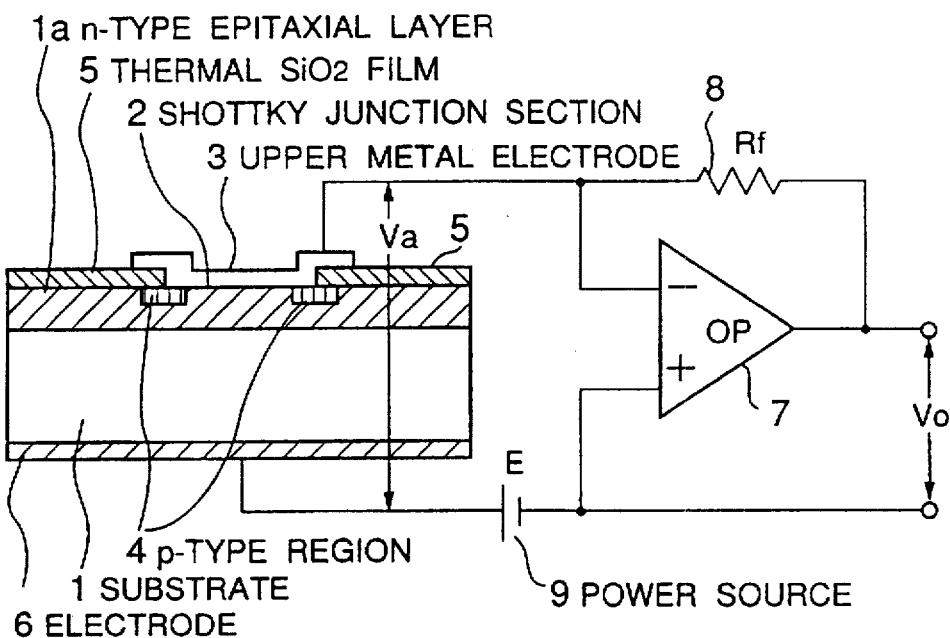
FIG. 1 is a diagram showing a constitution of a conventional Shottky barrier junction temperature sensor.
Figure 2:
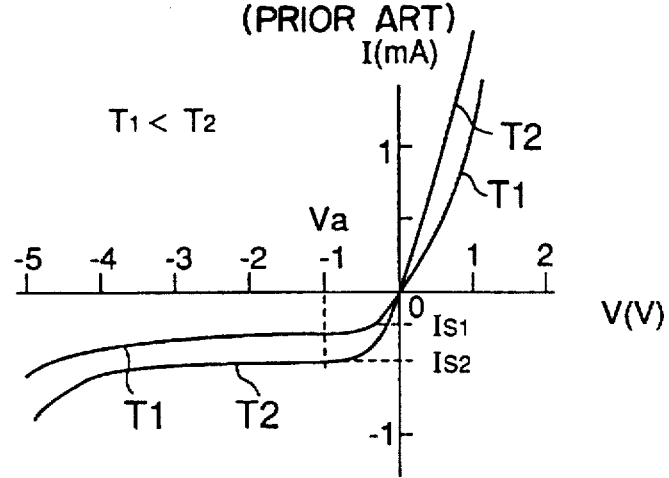
FIG. 2 is a graph for explaining voltage-current characteristic of a Shottky barrier diode in the Shottky barrier junction temperature sensor of FIG. 1.

Specifically, the SBT 21C in this embodiment possesses a rear surface etching structure. The constitution of the SBT 21C is principally the same as that of the SBT 21 shown in FIG. 2, and a trapezoid-shaped air gap 300C formed by etching treatment is formed under the silicon substrate 201 (at a side opposite to the surface where the metal silicide layer 211C is formed).

Next, an operation of the infrared-ray image sensor of this embodiment will be described. The operation of this infrared-ray image sensor is approximately the same as that of the embodiment shown in FIG. 7.

First, in an initial state, a voltage signal at low in level is being applied to the polysilicon gate electrode 224 (the gate of the MOS switch 20), so that the MOS switch 11 is kept as a turning off state. It should be noted that the SBT 21C and the source (the guard ring 221C) of the MOS switch 11 are kept to be charged with initial charges.

Storing of the initial charges allows an n$^+$-type diffusion layer (not shown) of the silicon substrate 201 to be applied with a voltage of, for example, +5 V. That is, a reverse direction bias is applied to the SBT 21C. Thus, a reverse current in accordance with the Shottky barrier height of the SBT 21 flows exceeding the depletion layer (inside the guard ring 221C under the metal silicide layer 211C), and the charges are discharged from the SBT 21 and the source region (the guard ring 221C).

This reverse current disappears when a voltage produced by the charges stored in the SBT 21 and the source region of the MOS switch 11 (the guard ring 221C) becomes 0 V. In addition, the discharging time of the charges is a half of the saturation time, which is a time ranging from the beginning of charge discharging to the saturation state.

Then, when a voltage signal at high in level is applied to the gate (the polysilicon gate electrode 224) of the MOS switch 11, the MOS switch 20 is turned on. Thus, the charges equal to the difference between the initial charges and the residual charges flow into the drain region (the p-type diffusion layer 22) through the alminium electrode 26.

Also in the infrared-ray image sensor of this embodiment, the n-type silicon having the crystal surface orientation <111> as the element formation surface is employed as the silicon substrate 201C and the platinum silicide layer is employed as the metal silicide layer 211C, so that the storing time of the signal charge will be 30 msec, similar to the embodiment shown in FIG. 7. In addition, in this embodiment, since the infrared-ray light receiving section (the SBT 21C) possesses the heat insulating structure, the infrared-ray detection sensitivity is further enhanced.

Figure 12:
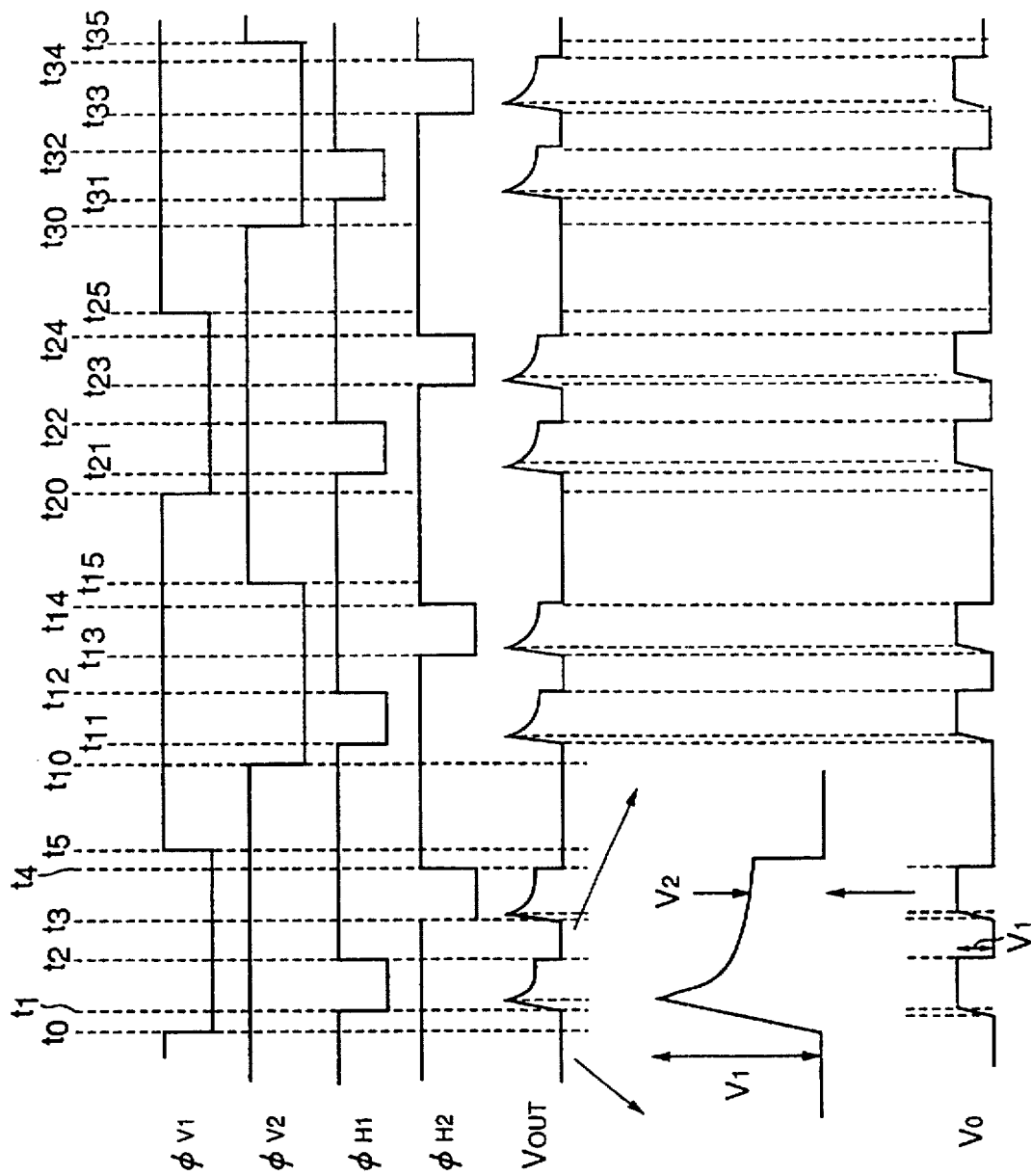
FIG. 12 is a timing chart for explaining an operation of the infrared-ray image sensor of FIG. 6.

Next, referring to FIG. 12, an operation of the infrared-ray image sensor will be described. FIG. 12 shows wave shapes of driving pulses $\Phi_{H1}$, $\Phi_{H2}$, $\Phi_{V1}$, and $\Phi_{V2}$ provided from the horizontal scanning circuit 32 and the vertical scanning circuit 31, and a timing chart illustrating the temporal changes of the wave shapes of the outputs provided from the common terminal.

First, at time $t_0$, the driving pulse $\Phi_{V1}$ from the vertical scanning circuit 31 changes to be low in level, and the vertical switches 11 and 12 are turned on. Subsequently, at time $t_1$, the driving pulse $\Phi_{H1}$ from the horizontal scanning circuit 32 changes to be low in level, so that the horizontal switch 35 is turned on. Thus, the Shottky barrier diode (the light receiving section) 21 and the output terminal 39 are electrically connected, the output terminal 39 being connected to the output voltage source (the power source) 34 and the resistor 33. Synchronized with the electrical connection of the output terminal 39 to the Shottky barrier diode 21, first, the parasitic capacitance C21 of the Shottky barrier diode 21 is precharged with an output voltage $V_B$ of the power source 34, that is, the capacitance C21 is charged. Thus, an output voltage $V_{OUT}$ rises to a voltage value $V_1$, and then begins to fall after completion of the precharge. Then, the voltage value $V_1$ is held by the sample hold circuit 49.

When the reverse current $I_R$ of the Shottky barrier diode 21 is large, the output voltage $V_{OUT}$ falls only to $V_2$: $I_R \times R$, while turning on of the horizontal switch 35 (while the driving pulse $\Phi_{H1}$ is at low in level). Thereafter, at time $t_2$, the driving pulse ($\Phi_{H1}$ from the horizontal scanning circuit 32 returns to an initial level, and the horizontal switch 35 is turned off. Upon turning off of the horizontal switch 35, the output voltage $V_{OUT}$ returns to the level $V_O$ which is a level before turning on of the horizontal switch 35. Moreover, discharging of the charges stored in the parasitic capacitance C21 of the Shottky barrier diode 21 begins, the discharging being caused due to the reverse current $I_R$.

Next, in time $t_3$, the driving pulse $\Phi_{H2}$ from the horizontal scanning circuit 32 changes its level to a low level. Thus, similar to the foregoing case, the parasitic capacitance C22 of the Shottky barrier diode 22 is precharged by a voltage $V_B$ of the power source 34. For this reason, the output voltage $V_{OUT}$ rises to a voltage value $V_1$ and begins to fall, and the voltage value $V_1$ is held by the peak hold circuit 49.

When the reverse current $I_R$ of the Shottky barrier diode 22 is large, the output voltage $V_{OUT}$ falls only to $V_2$ ($I_R \times R$) while the horizontal switch 36 is turned on. Thereafter, at time $t_4$, the driving pulse $\Phi_{H2}$ from the horizontal scanning circuit 2 returns to the initial level, and the horizontal switch 36 is turned off. Upon turning off of the horizontal switch 36, the output voltage $V_{OUT}$ returns to the level $V_B$ which is the level before turning on of the horizontal switch 36. In addition, discharging of the charges stored in the parasitic capacitance of the Shottky barrier diode 22 start, the discharging of the charges being caused due to the reverse current $I_R$.

Thereafter, the driving pulse $\Phi_{V1}$ from the vertical scanning circuit 31 returns to the initial level.

Next, in time $t_{10}$, the driving pulse $\Phi_{V2}$ from the vertical scanning circuit 31 is rendered to be low in level, and the vertical switches 13 and 14 are turned on. Subsequently, at time $t_{11}$, the driving pulse $\Phi_{H1}$ from the horizontal scanning circuit 32 is rendered to be low in level, and the horizontal switch 35 is turned on. Thus, first, the parasitic capacitance C23 of the Shottky barrier diode 23 is precharged by a voltage $V_B$ of the power source 34, synchronized with an electrical conduction of the Shottky barrier diode 23 and the output terminal 39. For this reason, the output voltage $V_{OUT}$ is raised to the voltage value $V_1$, and then begins to fall after completion of precharging. Then, the voltage $V_1$ is held by the peak hold circuit 49.

When the reverse current $I_R$ of the Shottky barrier diode 23 is large, the output voltage $V_{OUT}$ falls only to a level of $V_2$ ($I_R \times R$) while the horizontal switch 35 is being turned off. Thereafter, at time t12, the driving pulse $\Phi_{H1}$ from the horizontal scanning circuit 32 returns to the initial level. When the horizontal switch 35 is turned off, the output voltage $V_{OUT}$ returns to a voltage level $V_0$ which is a level before turning on of the horizontal switch 35. In addition, discharging of the charges stored in the parasitic capacitance C23 of the Shottky barrier diode 23 starts, the discharging being caused by the reverse current $I_R$.

Next, at time $t_{13}$, the driving pulse $\Phi_{H2}$ of the horizontal scanning circuit 32 changes its level to a low level. Thus, synchronized with turning on of the horizontal switch 36, the parasitic capacitance C24 of the Shottky barrier diode 24 is precharged by a voltage $V_O$. For this reason, the output voltage $V_{OUT}$ rises to the voltage value $V_1$, and it begins to fall after completion of the precharge. Then, the voltage $V_1$ is held by the peak hold circuit 49.

When the reverse current IR of the Shottky barrier diode 24, the voltage V1 falls only to a level of $V_2$ ($I_R \times R$) while the horizontal switch 36 is being turned on. Thereafter, at time $t_{14}$, the driving pulse $\Phi_{H2}$ from the horizontal scanning circuit 32 returns to the initial level. When the horizontal switch 36 is turned off, the output voltage $V_{OUT}$ from the output voltage 39 returns to the level $V_O$ which is a level before turning on of the horizontal switch 36. In addition, discharging of the charges stored in the parasitic capacitance C24 of the Shottky barrier diode 24 begins, the discharging being caused due to the reverse current $I_R$.

Thereafter, the driving pulse $\Phi_{V2}$ from the vertical scanning circuit 31 returns to the initial level.

Next, after time $t_{20}$, the foregoing operations are repeated. Specifically, at time $t_{20}$, the driving pulse $\Phi_{V1}$ from the vertical scanning circuit 31 is rendered to be low in level, and the vertical switches 11 and 12 are turned on. Subsequently, at time $t_{21}$, the driving pulse $\Phi_{H1}$ from the horizontal scanning circuit 32 is rendered to be low in level, and the horizontal switch 35 is turned on. Thus, synchronized with the conduction of the Shottky barrier diode 21 and the common terminal 39, first, the parasitic capacitance of the Shottky barrier diode 21 is precharged by the voltage $V_B$ of the power source 34. Then, the voltage $V_1$ is held by the peak hold circuit 49.

At this time, the charges stored in the Shottky barrier diode 21 at time $t_2$ are discharged for a period from time $t_2$ to $t_{21}$. The charges correspondint to the dischared charges are precharged.

The higher is the temperature of the Shottky barrier diode 21, the larger is the reverse current thereof, and the lower is the temperature of the Shottky barrier diode 21, the smaller is the reverse current thereof. Therefore, the amount of the charges discharged for a prescribed period of time, which are stored therein, is larger, as the temperature thereof is higher. The amount of the charges is smaller, as the temperature thereof is lower. Therefore, the output voltage V1 from the output terminal 39 at the time when the Shottky barrier diode 21 is precharged will be in proportion to the temperature of the Shottky barrier diode. As described above, a mode that a signal according to an output voltage at the time of precharging is detected shall be called "a storing mode" for the foregoing "current mode".

Descriptions for the Shottky barrier diodes 22 to 24 are omitted, output voltages $V_1$ in accordance with temperatures of the diodes 22 to 24 are obtained in the similar manners to the foregoing cases for the diodes 22 to 24.

Therefore, the output voltage $V_1$ of the output terminal 39 is subjected to a peak holding so that the voltage is sampled. Thus, the temperature at each of the light receiving sections are detected so that an infrared-ray image can be obtained. In this case, the period from time $t_1$ to time $t_{21}$ corresponds to a storing time (a discharging time), for example, 1/60 sec.

FIG. 13 is a table showing values of a Shottky barrier height of various kinds of silicides for n-type silicon (Silicides for VLSI Applications, S. P. Muraka, issued by ACADEMIC PRESS). The Shottky barrier diodes having the Shottky barrier value of, for example, 0.7 to 0.94 eV may be employed in the foregoing embodiments among the Shottky barrier diodes shown in FIG. 12. This is because a later-described shutter function is occasionally needed for the Shottky barrier diodes having Shottky barrier value not more than 0.7 eV.

In the embodiment shown in FIG. 6, one horizontal switch is arranged for the vertical reading out line 37, and, similarly, one horizontal switch 36 is arranged for the vertical reading out line 38. Specifically, one horizontal switch is arranged for each of the vertical reading out lines. However, it is possible to arrange one horizontal switch for each of the light receiving sections.

(Second Embodiment)

Figure 14:
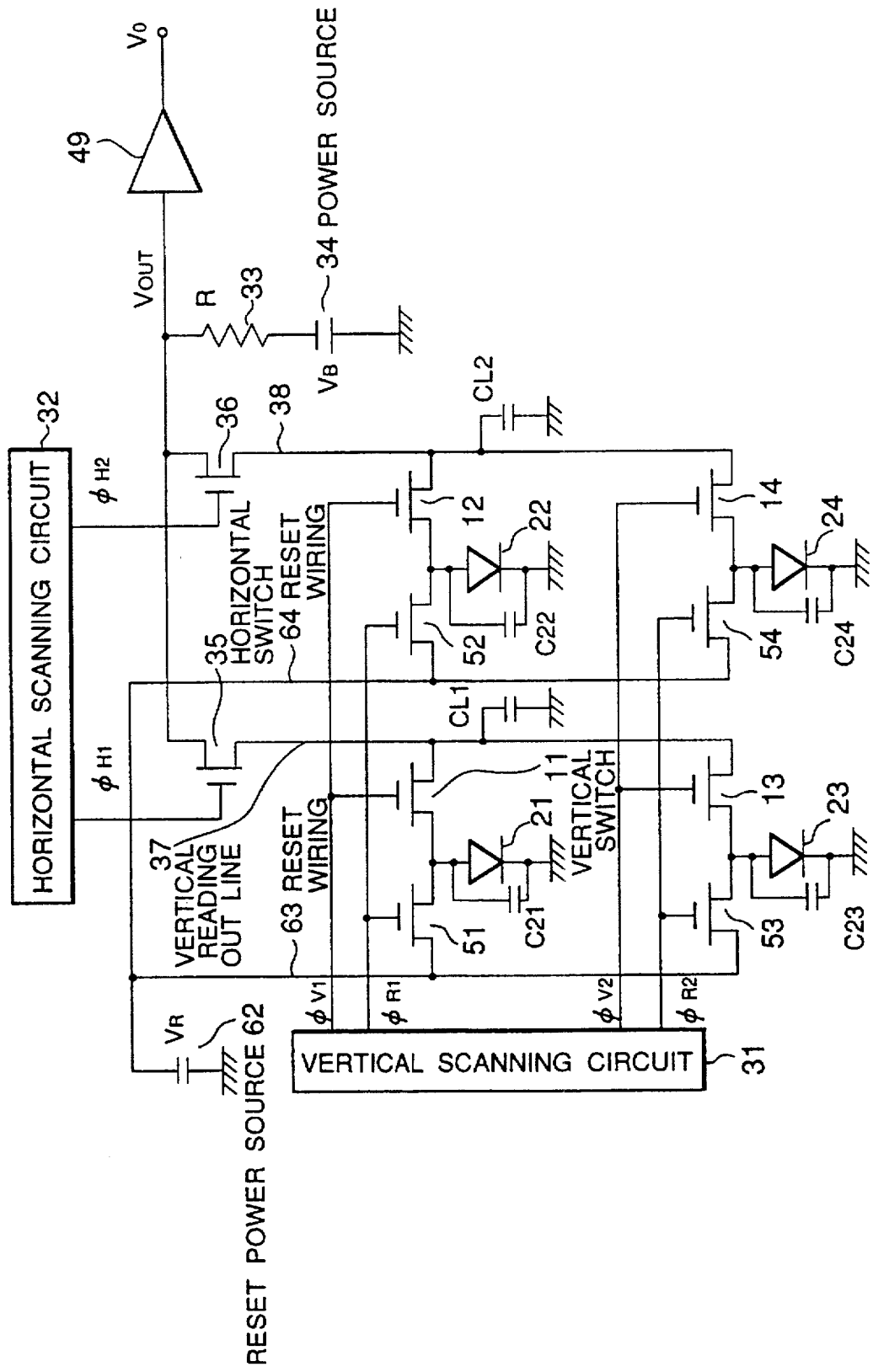
FIG. 14 is a constitution diagram of an infrared-ray image sensor of a second embodiment of the present invention.

FIG. 14 is a circuit diagram showing a constitution of the second embodiment of the thermal type infrared-ray image sensor of the present invention. The constitution of this embodiment is different from the embodiment of FIG. 6 in that a reset power source 2 and MOS transistors 51 to 54 are newly arranged, and the MOS transistors 51 to 54 allows the reset power source 62 to apply a reset voltage $V_R$ to the light receiving sections 21 to 24, the MOS transistors 51 to 54 being the turned on/off synchronized with driving pulses $\Phi_{R1}$ and $\Phi_{R2}$ provided from the vertical scanning circuit 61.

Specifically, the drains of reading out p-type MOS transistors (the vertical switches) 11 to 14 and the drains of reset p-type MOS transistors 51 to 54 are connected to the Shottky barrier diodes 21 to 24, each of which is formed of silicide and n-type silicon as shown in FIG. 13. In addition, the sources of reading out p-type MOS transistors 11 and 13 are connected to the first column output wiring (the vertical reading out line) 37. The sources of the reading out p-type MOS transistors 12 and 14 are connected to the second output wiring 38.

Furthermore, the sources of the reset MOS transistors 51 and 53 are connected to the first column reset wiring 63. The sources of the reset MOS transistors 52 and 54 are connected to the second reset wiring 64. In addition, the gates of the reading out MOS transistors 11 to 14 are connected to the vertical scanning circuit 61. The driving pulse $\Phi_{V1}$ provided from the vertical scanning circuit 61 is supplied to the reading out MOS transistors 11 and 12. The driving pulse $\Phi_{V2}$ provided from the vertical scanning circuit 61 is supplied to the reading out MOS transistors 13 and 14.

Moreover, the gates of the reset MOS transistors 51 to 54 are connected to the vertical scanning circuit 61. The driving pulse $\Phi_{R1}$ provided from the vertical scanning circuit 61 is supplied to the reset MOS transistors 51 and 52. The driving pulse $\Phi_{R2}$ provided from the vertical scanning circuit 61 is supplied to the reset MOS transistors 53 and 54.

Furthermore, the first column output wiring 37 is connected to the drain of a horizontal output p-type MOS transistor (the horizontal switch) 35 and the second column output wiring 38 is connected to the drain of a horizontal output p-type MOS transistor 36. In addition, First and second reset column reset wirings 63 and 64 are connected to the reset power source 62, respectively.

The sources of the horizontal output p-type MOS transistors 35 and 36 are connected to the power source 34 through an output resistor 33. The gates of the horizontal output p-type MOS transistors 35 and 36 are connected to the horizontal scanning circuit 32, respectively. The driving pulse $\Phi_{H1}$ provided from the horizontal scanning circuit 32 is supplied to the gate of the horizontal output p-type MOS transistor 35. The driving pulse $\Phi_{H2}$ provided from the horizontal scanning circuit 32 is supplied to the gate of the horizontal output p-type MOS transistor 36.

The horizontal scanning circuit 32 and the vertical scanning circuit 61 are composed of shift registers, respectively, similar to the embodiment shown in FIG. 6, and are driven by clock pulses and start pulses. The vertical scanning circuit 61 is designed so as to provide twice as many pulses as the vertical scanning circuit 31. To provide the pulses twice those of the vertical scanning circuit 31, for example, there is a way that the conventional shift registers are arranged in parallel in two columns, and two start pulses are produced, one being used for an output and the other being used for a reset.

Figure 15:
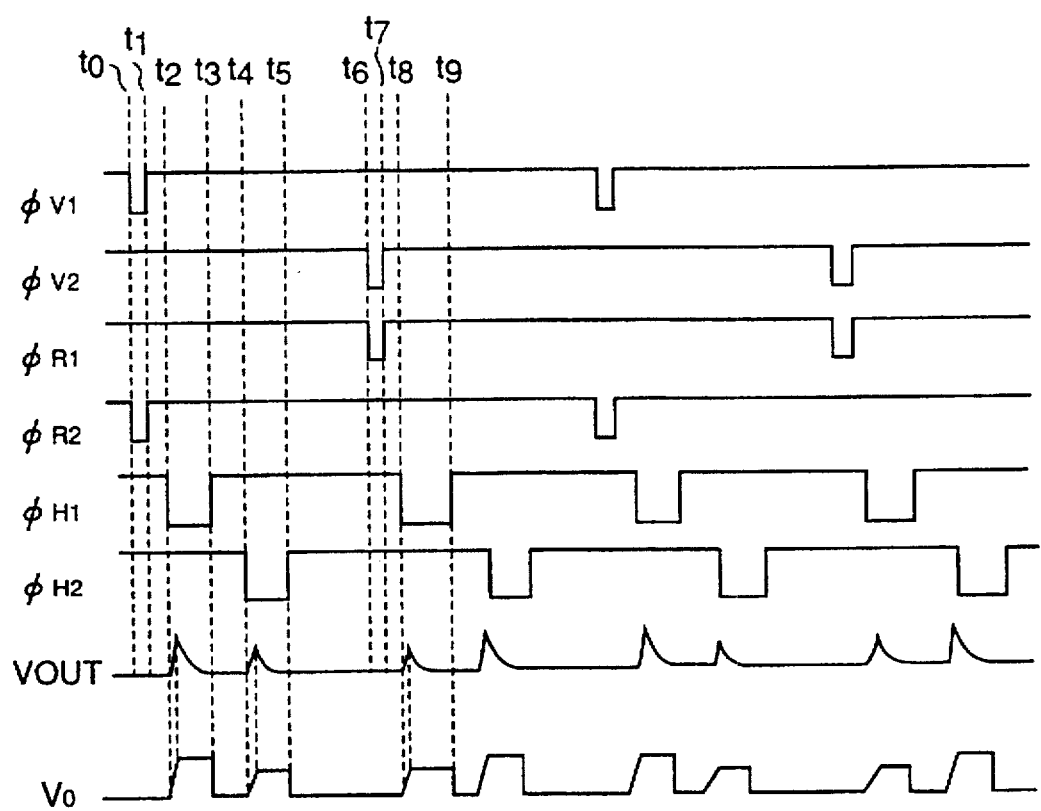
FIG. 15 is a timing chart for explaining an operation of the infrared-ray image sensor of FIG. 14.

FIG. 15 shows temporary changes of output wave shapes of the driving pulses $\Phi_{H1}$, $\Phi_{H2}$, $\Phi_{V1}$, and $\Phi_{V2}$ produced from the horizontal scanning circuit 32 and the vertical scanning circuit 61. As shown in FIG. 15, the start pulses are sequentially transferred by the shift registers, and the driving pulses $\Phi_{H1}$ and $\Phi_{H2}$ are rendered from high to low in level for one horizontal scanning period.

The vertical scanning circuit 61 transfers the start pulses sequentially by the shift registers for one field period, and the reading out pulses $\Phi_{V1}$ and $\Phi_{V2}$ are sequentially rendered from high to low in level. Moreover, when the shutter function is executed, since the reset pulses $\Phi_{R1}$ and $\Phi_{R2}$ are rendered to be low in level prior to the driving pulses $\Phi_{V1}$ and $\Phi_{V2}$ by a shutter time, the start pulses for resetting are input prior to the start pulses for resetting by the shutter time. Since the start pulses must be synchronizes with clocks, the shutter time shall select an integer multiple of one horizontal scanning period.

The embodiment shown in FIG. 14 is described as an infrared-ray image sensor having a structure of two rows and two columns for simplicity of the description. Therefore, driving pulses for the shutter function shown in FIG. 15 are for one horizontal scanning period. Moreover, vertical retrace lines are omitted.

An operation of the embodiment shown in FIG. 14 will be described with reference to FIG. 15. First, at time $t_0$, the driving pulses $\Phi_{V1}$ and $\Phi_{V2}$ from the vertical scanning circuit 61 are rendered to be low in level. The MOS transistors (the vertical switches) 11 and 12 and MOS transistors 53 and 54, which are formed of a p-type MOS transistor, are turned on (opened). The Shottky barrier diodes 23 and 24 serving as the light receiving section are reset to a voltage value $V_R$ of the reset power source. At the same time, the Shottky barrier diodes 21 and 22 become the voltage $V_2$ shown by the later described equation 4. In addition, at this time, the charges stored in the Shottky barrier diodes 21 and 22 are provided to the vertical reading out lines 37 and 38, respectively.

Next, at time $t_1$, the driving pulses $\Phi_{V1}$ and $\Phi_{V2}$ return to be high in level. The MOS transistors 11, 12, 53, and 54 are turned off (closed) and are reset by the reset power source 62. The discharging of the charges stored in the Shottky barrier diodes 23 and 24 begins.

Subsequently, at time $t_2$, the driving pulse $\Phi_{H1}$ from the horizontal scanning circuit 32 rendered to be low in level, and the horizontal switch 35 are turned on. Reading out for the Shottky barrier diode 21 is performed. Specifically, the first column vertical reading out line (the vertical output wiring) 37 having parasitic capacitances $C_1$ and $C_2$ is reset at the output voltage $V_B$ of the power source 34. The reset current at this time is converted to a voltage in the output resistor 33, and an output wave shape $V_{OUT}$ shown in FIG. 15 is obtained. The signal of this output wave shape $V_{OUT}$ is converted to a video signal thereby obtaining an infrared-ray image.

Next, at time to, the driving pulse $\Phi_{H1}$ from the horizontal scanning circuit 32 returns to be high in level so that the horizontal switch 35 is turned off.

At time t4, the driving pulse $\Phi_{H2}$ from the horizontal scanning circuit 32 is rendered to be low in level so that the horizontal switch 36 is turned on. Similar to the foregoing case, a reading out operation for the Shottky barrier diode 22 is performed.

Next, at time t5, the driving pulse $\Phi_{H2}$ from the horizontal scanning circuit 32 returns to be high in level so that the MOS transistor 36 is turned off. Thus, the scanning operation for the first column is completed.

Next, a scanning operation for the second column is begun from time $t_6$. Specifically, at time t6, the driving pulses $\Phi_{V2}$ and $\Phi_{R1}$ from the vertical scanning circuit 61 are rendered to be low in level. The discharging of the Shottky barrier diode 23 continues until immediately before the level change of the driving pulses $\Phi_{V2}$ and $\Phi_{R1}$, so that the discharging period will be time $(t_6-t_1)$ from time $t_1$ to time $t_6$. Therefore, when the magnitude of the discharging current of the Shottky barrier diode 23 is assumed to be a constant value $I_R$ for this period of time (period), the amount of the discharging is given by the following equation.

$$\text{Discharging amount} = I_R \times (t_6 - t_1) \tag{1}$$

Assuming that the value of the parasitic capacitance C23 of the Shottky barrier diode 23 be $C_D$, since the Shottky barrier diode 23 has been reset to the voltage $V_R$ by the reset power source 62 before discharging, at time $t_1$, the charges of the charging amount expressed by $C_D \times V_R$ is charged. Therefore, the residual charges $Q_D$ are given by the following equation.

$$Q_D = C_D \times V_R - I_R (t_6 - t_1) \tag{2}$$

On the other hand, immediately before time $t_6$, a voltage at the vertical reading out line 37 is equal to the voltage $V_B$ so that the charge amount $Q_L$ vertical reading out line 37 will be given by the following equation, when the value of the parasitic capacitance $C_{L1}$ of the line 37 is $C_L$.

$$Q_L = C_L \times V_O \tag{3}$$

At time $t_6$, since the MOS transistor is turned on, the charge amount $Q_D$ expressed by the equation 2 and the charge amount $Q_L$ expressed by the equation 3 are combined. Therefore, assuming that a voltage at the vertical reading out line 37 from time $t_6$ to $t_7$ be $V_2$, the voltage $V_2$ is given by the following equation.

$$V_2 = (Q_D + Q_L)/(C_D + C_L) = (C_D \times V_R + C_L \times V_O - I_R \times (t_6 - t_1))/(C_D + C_L) \tag{4}$$

Next, at time $t_7$, when the MOS transistor 13 is turned off, the charge amount $Q_2$ of the vertical reading out line 37 is given by the following equation.

$$Q_2 = C_L \times V_2 \tag{5}$$

Next, at time $t_8$, the driving pulse $\Phi_{H1}$ from the horizontal scanning circuit 32 is rendered to be low in level so that the MOS transistor 35 is turned on. Thus, a voltage at the vertical reading out line 37 is reset at the voltage $V_B$ of the power source 34, and the line 37 is recharged (precharged) to the charge amount $Q_L$. Therefore, the output charge amount $Q_{OUT}$ will be equal to the difference between the charge amounts $Q_L$ and $Q_2$, and it is given by the following equation.

$$\begin{aligned} Q_{OUT} &= Q_L - Q_1 \\ &= (C_L \times C_D \times (V_0 - V_R) + C_L \times I_R \times \\ &\quad (t_6 - t_1))/(C_D + C_L) \end{aligned} \tag{6}$$

Here, since the capacitance $C_L$ of the vertical reading out line is ordinarily larger sufficiently the capacitance $C_D$ of the Shottky barrier diode 23, by replacing the dominator $(C_D + C_L)$ with $C_L$ in the equation 6, the output charge amount $Q_{OUT}$ can be expressed by the following equation.

$$Q_{OUT} = C_D \times (V_D - V_R) + I_R \times (t_6 - t_1) \tag{7}$$

Therefore, the charges according to the reverse current $I_R$ of the Shottky barrier diodes 21 to 24, shown by the equation 7, are provided from the diodes 21 to 24. From these outputs, the whole picture image plane, in this case, can be composed of two pixels in the horizontal directions and two pixels in the vertical direction, can be constituted.

Moreover, in the equation 7, when the voltage $V_B$ of the power source 34 and the voltage $V_R$ of the reset power source 62 are equal, the output voltage $V_{OUT}$ will be equal to the charge amount discharged from the Shottky barrier diode 23, and it is expressed by the following equation.

$$Q_{OUT} = I_R \times (t_6 - t_1) \qquad (8)$$

In addition, when the voltage $V_O$ pf the power source and the voltage $V_R$ of the reset power source are not equal, the charge amount expressed as $C_D \times (V_O - V_R)$ in the equation 7 is off-set. Utilizing this off-set, a drift correction of an element temperature which is a problem in the thermal type image sensor can be performed. As an example, there is a way to apply a feedback to the voltage $V_R$ of the reset power source 62 so that the output voltage $V_{OUT}$ has a constant direct current level.

In the foregoing embodiment, the description was made for the image sensor having two pixels and two pixels in a matrix for the simplicity of the description. The period $(t_6 - t_1)$ in the equation 7 corresponds to one horizontal scanning period, so that it will be $6.35 \times 10^{-5}$ sec.

Therefore, even when discharging of the charges stored in the Shottky barrier diodes (the light receiving section) 21 to 24 due to the reset voltage VR from the reset power source 62 is finished within, for example, $3 \times 10^{-4}$ sec, the storing time can be set at least at $6.35 \times 10^{-5}$ sec which is one scanning period.

Moreover, since the actual image sensor is composed of hundred of pixels and hundred of pixels, by changing timings of the reset pulses provided from the vertical scanning circuit 61, the storing time can be set at any integer multiple of one horizontal scanning period within the number of the vertical pixels. Therefore, in this embodiment, the storing time should be set at two horizontal scanning period $1.27 \times 10^{-4}$ sec or three horizontal scanning period $1.905 \times 10^{-4}$ sec.

As described above, by adding the shutter function and performing a shutter operation shorter for a period of time than that of discharging of the pixel section (the light receiving section), it is possible to detect the temperature difference of the pixel section as the difference of the charge amount discharged by the reverse current. Thus, infrared-ray image can be obtained.

As a value of the Shottky barrier height $\Phi_B$ of the Shottky barrier diode shown in FIG. 13 is smaller, the reverse current becomes larger. As shown in FIG. 13, only $HfSi_2$ possesses smaller Shottky barrier height $\Phi_B$ than $MoSi_2$, and other materials possess larger Shottky barrier height $\Phi_B$ than $MoSi_2$.

Therefore, by setting the shutter period at an integer multiple of one horizontal scanning period, it is possible to apply the present invention to the Shottky barrier diode employing almost suicides.

Or else, the Shottky barrier diode applied to the embodiment shown in FIG. 14 can be formed in order that its Shottky barrier value is not more than 0.7 eV where the shutter function is needed and not less than 0.53 eV which is smallest in the Shottky barrier shown in FIG. 13.

(Third Embodiment)

Figure 16:
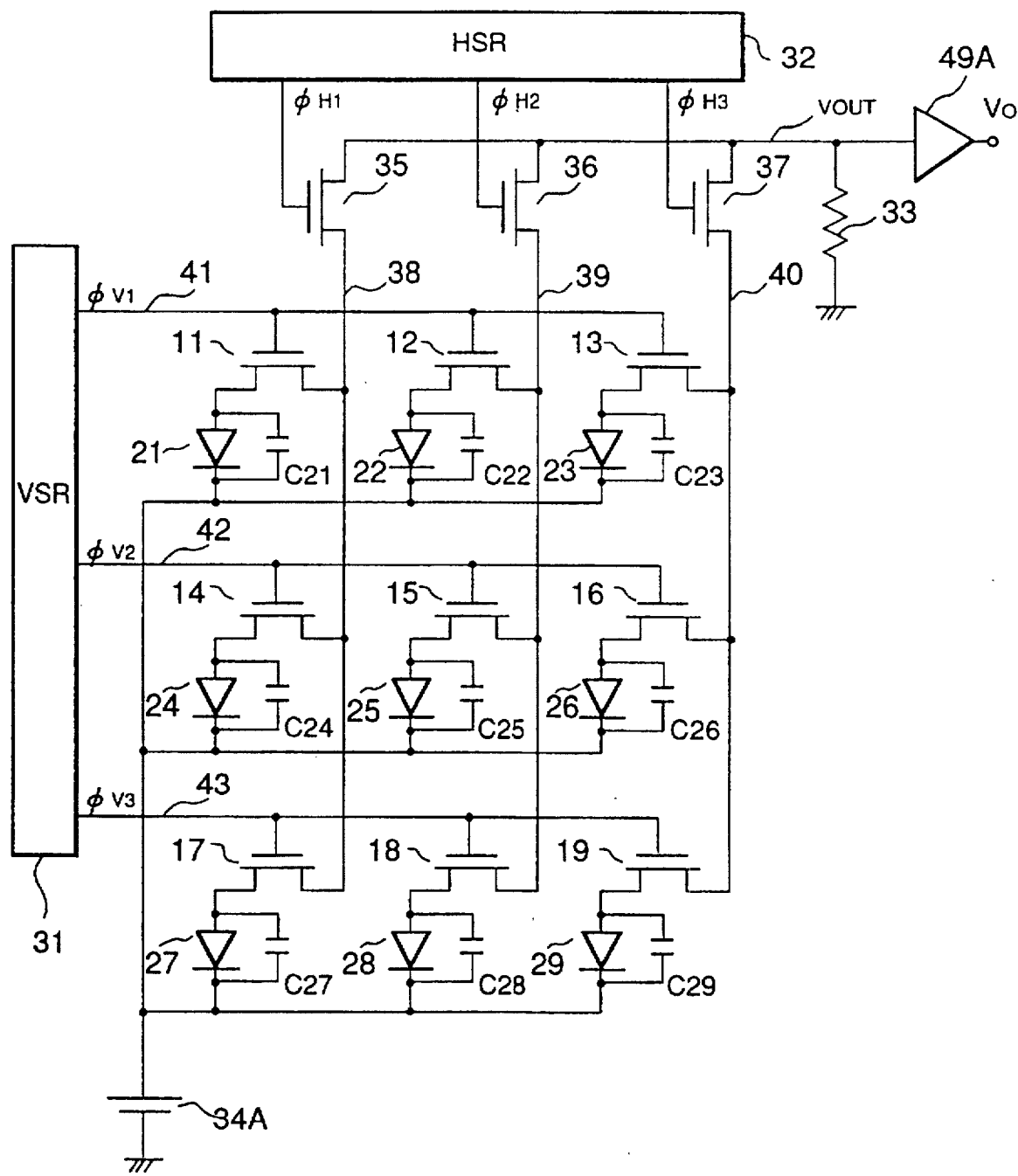
FIG. 16 is a constitution diagram of an infrared-ray image sensor of a third embodiment of the present invention.

FIG. 16 shows a schematical constitution of a thermal type infrared-ray image sensor according to a third embodiment of the present invention. The device shown in FIG. 16 comprises a plurality of diodes arranged in a row direction and in a column direction, i.e., in a horizontal direction and in a vertical direction, in a matrix at a predetermined pitch. Each of the diodes receives infrared-ray from a subject (not shown) and changes its temperature by heat thereof. For simplicity of the description, three diodes are arranged in the row and column directions in FIG. 16, each being corresponding to one pixel. Actually, several hundred of diodes, each constituting pixel, are arranged.

Each of the diodes 21 to 29 has a parasitic capacitance. In FIG. 16, these parasitic capacitances are denoted with reference symbols C21 to C29. In addition, Source electrodes of the MOS transistors 11 to 19, each of which serves as a switching element, are connected to the anodes of the corresponding diodes 21 to 29. The drain electrodes of the MOS transistors 11, 14, and 17 are connected to the vertical line 38. The drain electrodes of the MOS transistors 12, 15, and 18 are connected to the vertical line 39. The drain electrode of the MOS transistors 13, 16, and 19 are connected to the vertical line 40. The lines 38, 39, and 39 are arranged for every column.

The gate electrodes of the MOS transistors 11 to 13 arranged in the same row are connected in common, the gate electrodes of the MOS transistors 14 to 16 arranged in the same row are connected in common, and the gate electrodes of the MOS transistors 17 to 19 arranged in the same row are connected in common. They are connected to the vertical driving circuit 31 through the corresponding horizontal lines 41 to 43. In addition, the cathodes of the diodes 21 to 29 are connected in common to, for example, a power source 32 of a positive voltage.

Furthermore, the vertical lines 38 to 40 are connected to the source electrodes of the corresponding MOS transistors 35 to 37. The gate electrodes of the horizontal MOS transistors 35 to 37 are connected to the horizontal driving circuit 32, and receive sequentially the horizontal driving signals $\Phi_{H1}$, $\Phi_{H2}$, and $\Phi_{H3}$ as described later. Moreover, the drain electrodes of the horizontal MOS transistor 35 to 37 are connected in common to the horizontal output line $V_{OUT}$. An output resistor 33 is connected between the horizontal output line $V_{OUT}$ and a ground. The horizontal output line VOUT is connected to a horizonal output terminal and is connected to a peak hold circuit 49A.

Figure 17:
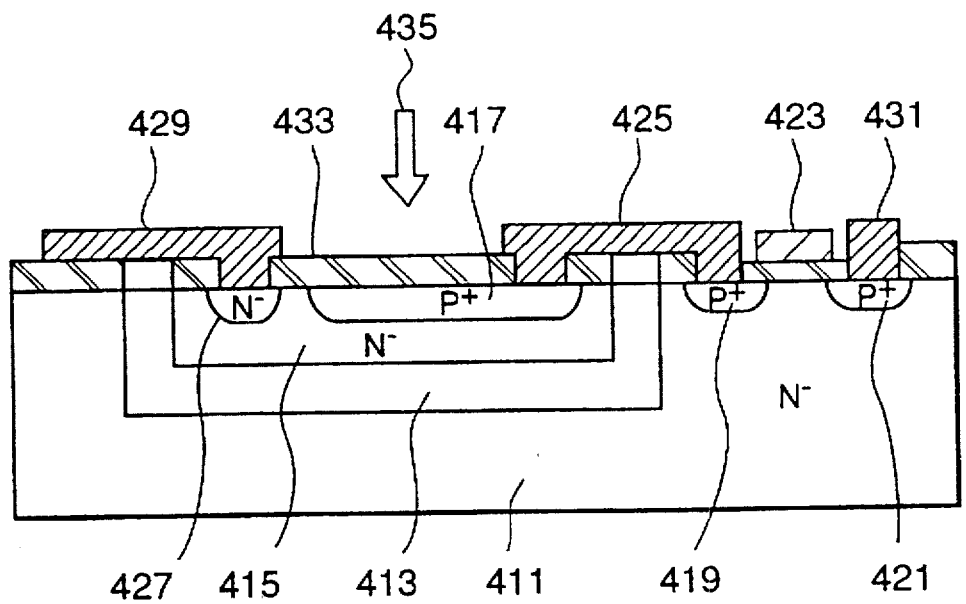
FIG. 17 is a sectional view showing a first example of a constitution of one pixel of the infrared-ray image sensor of FIG. 16.

FIG. 17 shows a constitution example of the pixel section of the thermal type infrared-ray image sensor of FIG. 16. In FIG. 17, a PN junction diode, that is, a PN diode, is used as the diodes. In the constitution of FIG. 17, the PN diode is formed separating from, for example, an N-type substrate 411 with a space 413. The PN diode is composed of an N-type substrate 415 and a P$^+$-type diffusion layer 417 formed on the substrate 415. Furthermore, a P$^+$-type diffusion layer 419 forming a source of an MOS transistor and a P$^+$-type diffusion layer 421 forming a drain region thereof are formed on a different semiconductor substrate 411 from that on which the PN diode is formed. In addition, a gate electrode 423 is formed on the upper surface of the substrate region interposing an oxide film, the substrate region being between the P$^+$-type diffusion layers 419 and 421.

The P$^+$-type diffusion region 417 of the foregoing PN diode is connected a source diffusion region of the MOS transistor as a P terminal of the PN diode by a wiring member 425 such as alminium or titanium. Moreover, an N$^+$-type diffusion layer 427 is formed on the N-type substrate of the PN diode, and the N$^+$-type diffusion region 427 is connected as an N terminal of the PN diode to a power source 32(not shown, see FIG. 16) by a wiring member 429 such as alminium or titanium.

Furthermore, the P$^+$-type diffusion region 421 constituting the drain electrode of the MOS transistor is connected to a vertical line (not shown) which is the wiring member 31 such as alminium or titanium.

In addition, a protection oxide film 433 is formed on the entire surface of the P$^+$-type diffusion region 417 of the PN diode and the substrate 415.

In the constitution of FIG. 17, in order to obtain an excellent heat insulation, infrared-ray of the subject is irradiated onto the PN diode separated from the substrate 411 by the space 413, as indicated by the arrow line 435. Thus, a temperature of the PN diode increases, and the magnitudes of the forward and reverse currents of the PN diode vary according to the increase in the temperature.

Figure 18:
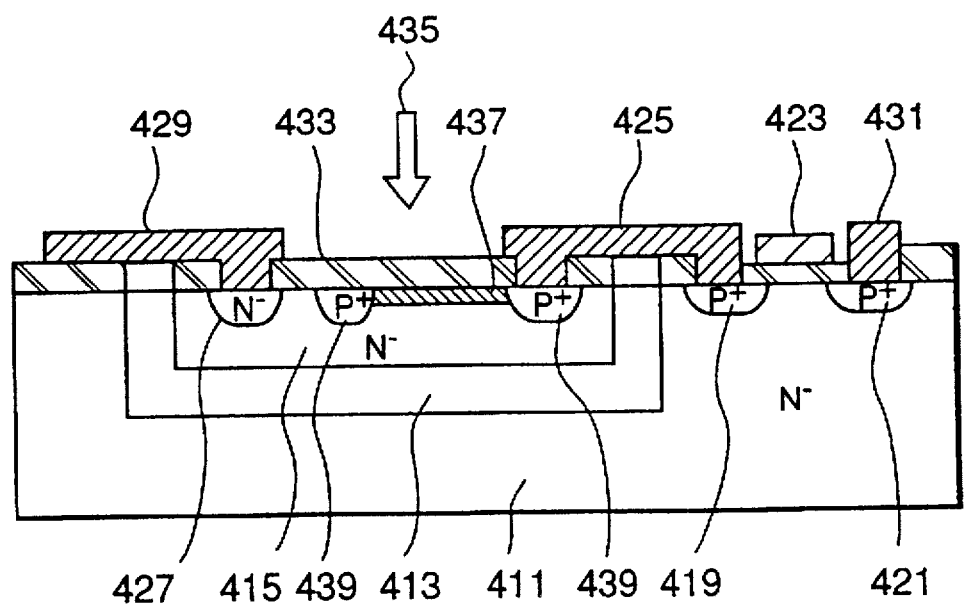
FIG. 18 is a sectional view showing a second example of a constitution of one pixel of the infrared-ray image sensor of FIG. 16.
Figure 19:
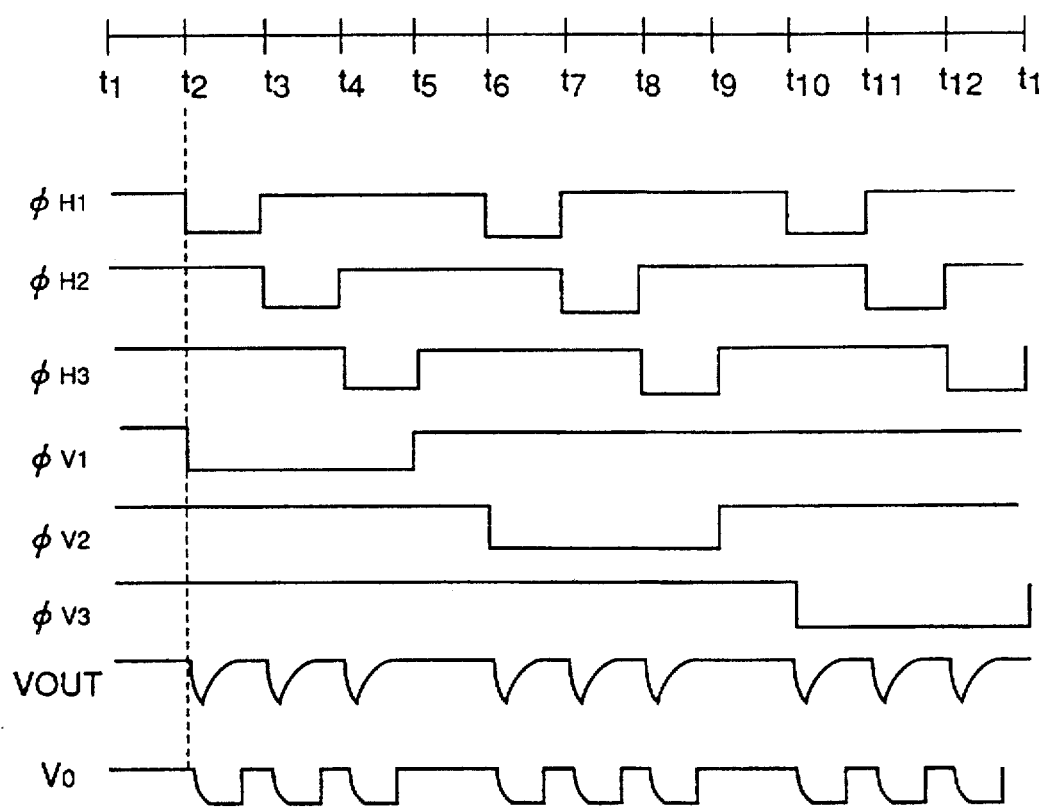
FIG. 19 is a timing chart for explaining an operation of the infrared-ray image sensor of FIG. 16.

FIG. 18 shows another constitution example of the pixel section of the thermal type infrared-ray image sensor of FIG. 16. In the constitution of FIG. 18, the Shottky barrier diode is used as diodes receiving infrared-ray. Specifically, in the diode portion of FIG. 18, a silicide layer 437 is formed on the surface of the N-type substrate 415 and the $P^+$-type diffusion layer 439 is formed around the silicide layer 437. The Shottky barrier diode is formed at the boundary between the silicide layer 437 and the N-type substrate 415. The $P^+$-type diffusion 439 leading to the silicide layer 437 is connected to the $P^+$-type diffusion layer 419 serving as the source electrode of the MOS transistor by the wiring member 425 such as alminium or titanium. Other portions have the same constitution as those of FIG. 17, and the same components are given with the same reference numerals. In the case of the Shottky barrier diode, since the thickness of the silicide layer 437 is made thinner than the case of the PN diode, the whole of the diode portion can be made thinner and thermal capacitance thereof can be reduced. Thus, a detection sensitivity can be enhanced.

An operation of the thermal type infrared-ray image sensor having the foregoing constitution will be described with reference to a signal waveform chart.

In the device of FIG. 16, it should be noted that the MOS transistors 11 to 19 constituting the switch elements of the pixels and the MOS transistors 35 to 37 constituting the horizontal reading out switch elements are P-type MOS transistors. Therefore, when a logic level of the driving pulse applying to the gate of these MOS transistors is low, these MOS transistors are turned on.

First, for a period from time $t_2$ to $t_5$, the row selection signal $\Phi_{V1}$ provided from the vertical driving circuit 31 is rendered to be low in level. The MOS transistors 11 to 13 of the first row of FIG. 16 are turned on. Then, for a period from time $t_2$ to $t_3$, the column selection signal $\Phi_{H1}$ from the horizontal driving circuit 5 is rendered to be low in level, and the MOS transistor 35 is turned on. Therefore, the diode 21 is connected to the resistor 33 through the transistor 11, 35, and the horizontal output line $V_{OUT}$. Thus, the parasitic capacitance C21 of the diode 21 is precharged to a voltage of the power source 34 by a reverse bias. The parasitic capacitances of the diodes 22 and 23 are also precharged sequentially for a period from time $t_3$ to $t_4$ and for a period from time $t_5$ to $t_6$.

Next, for a period from t6 to t9, the row selection signal $\Phi_{V2}$ is rendered to be low in level, and the transistors 14 to 16 of the second row are turned on. Then, at time $t_6$, $t_7$, and $t_8$, the MOS transistors 35 to 37 are sequentially turned on, and the parasitic capacitances C24 to C26 of the diodes 24 to 26 are precharged to a voltage of the power source 34 by a reverse bias. Similarly, the parasitic capacitances C27 to 29 of the diodes 27 to 29 are also precharged sequentially. After time $t_{12}$, the time returns to the time t1 again. Each of the pulses is applied periodically and the foregoing operations are repeated periodically.

In such operations, for example, the diode 21 is in a floating state from time $t_3$ to $t_{12}$ and then until time $t_2$ of the next cycle. For this reason, the reverse current according to the temperature of the diode 21 flows therethrough. The charges stored in the parasitic capacitance C21 are discharged. Then, from time $t_2$ to $t_3$, the transistors 11 and 35 are turned on again, and the diode 21 and the resistor 33 are connected. Thus, the charges of the parasitic capacitance C21 are charged to a voltage of the power source again, which are discharged by the reverse current until disconnection of the diode 21 and the resistor 33. A signal $V_{OUT}$ appears at the terminal $V_{OUT}$, which is produced by the recharging current flowing through the resistor 33 at this time.

Specifically, the magnitude of the reverse current flowing through the diode 21 according to the temperature of the diode 21 changes, and consequently, the amount of the residual charges of the parasitic capacitance C21 also changes. Thereafter, the current, flowing when the parasitic capacitance C21 is charged again to a voltage of the power source 34, changes according to the residual charges. Therefore, the voltage $V_{OUT}$ produced across the resistor 33 by this recharging current becomes a signal according to the temperature of the diode 21.

The foregoing thermal type infrared-ray image sensor do not have to be cooled, different from the quantum type infrared-ray image sensor which must be cooled to a low temperature of about 77K. Therefore, the device constitution can be simplified and a low cost can be achieved.

By the way, with the thermal type infrared-ray image sensor as shown in FIG. 16, when a thermal image near a room temperature is viewed using an optical system of brightness F1.0 as a standard television format dynamic image, the minimum temperature resolution (NETD) of about 1K can be obtained.

Since NETD obtained by an ordinary quantum type infrared-ray image sensor is about 0.1K, it is preferable that NETD of the thermal type infrared-ray image sensor of the structure shown in FIG. 16 can be further reduced.

For this reason, the reason why NETD of the thermal type infrared-ray image sensor of FIG. 16 will be 1K is analyzed.

NETD is obtained by the following equation when noise component among the output of the image sensor, expressed by the electron number is N, and sensitivity expresses by the electron number is S/electron/K.

$$NETD = N/S \tag{9}$$

Moreover, when a temperature change of the pixels is R (K) at the time a temperature of an image picked-up body changes by 1K; the heat insulating structure of the pixels of FIG. 17 or FIG. 18 is employed; and an optical system of brightness F 1.0 issued, for example, R(K) becomes about 0.005 (K). Moreover, a temperature changing rate α of the reverse current of the diode is at most about 0.1.

Therefore, since the reverse current change of the diode of the pixels is R×α when the image picked-up body temperature changes by 1K, it will be about 0.005.

By the way, assuming that the thermal type infrared-ray image sensor of FIG. 16 operates with a storing time T of 1/30 sec employing a standard television system, the reverse current is $I_R$ (A), the value of the parasitic capacitances C21 and C28 are $C_D$(P), and the reverse bias voltage of the power source 34 is $V_R$(V), the charges $Q_0$(C) stored at the time of precharging is given by the following equation.

$$Q_0 = C_D \times V_R \tag{10}$$

Therefore, the charges Q1(C) discharged for the storing period T is given by the following equation.

$$Q_1 = I_R \times T \tag{11}$$

Here, since the discharging amount is larger than the charged amount, a signal disappears, so that the relationship $Q_1<Q_0$ must be established. Thus, the discharging amount $Q_1$ is set at about (½) $Q_0$, usually.

For example, if the dimension of the diode is 30 (μm²), CD=1×10⁻¹³(F), $I_R$=7 10⁻¹²(A), and VR=5(V) are satisfied. Consequently, $Q_0$=5×10⁻¹³(C), and $Q_1$=2.3×10⁻¹³(C) are satisfied.

Furthermore, since R×α is 0.0005 V, the changing rate $\Delta Q_1$ of the charges $Q_1$, at the time when the temperature of the image picked-up body changes by 1K. is given by the following equation.

$$\Delta Q_1 = I_R \times T \times R \times \alpha \tag{12}$$

When the foregoing value is substituted for this equation 12, $\Delta Q_1$ will be 1.17×10⁻¹⁶ (C/K). When the unit is converted from coulomb (C) to the number of electrons, $\Delta Q_1$ will be a sensitivity S, and it is given by the following equation.

$$S = \Delta Q_1/q = 7.3 \times 10^2 \text{(number of electron/K)} \tag{13}$$

where q is 1.5×10–9 (C/number of electrons), and it is the charge amount of electrons. Moreover, when the unit of the charge Q1 is converted to the number of electrons, it is given by the following equation.

$$Q_1' = Q_1/q = 1.44 \times 10^6 \text{(number of electrons)} \tag{14}$$

By the way, when the foregoing reverse current is stored for a predetermined period, it has been known that shot noises are produced. The shot noise N is a square root of the number of electrons stored, and it is given by the following equation.

$$N = (Q_1')^{1/2} = 1.2 \times 10^3 \text{(number of electrons)} \tag{13}$$

When major components of noises are assumed to be the shot noises from the equations 9, 13, and 15, NETD can be computed by the following equation.

$$NETD = 1.6(K) \tag{16}$$

Therefore, NETD can be improved by reducing the ratio of the shot noises shown by the foregoing computations to the signal. Assuming that noises includes only the shot noises, the following equation is obtained from the equations 9, and 11 to 15.

$$NETD = (1/R\alpha)(q/Q_1)^{1/2} \tag{17}$$

Therefore, although NETD is improved by increasing $Q_1$, since $Q_1<Q_0$ is established, $Q_0$ must be also larger.

(Fourth Embodiment)

Figure 20:
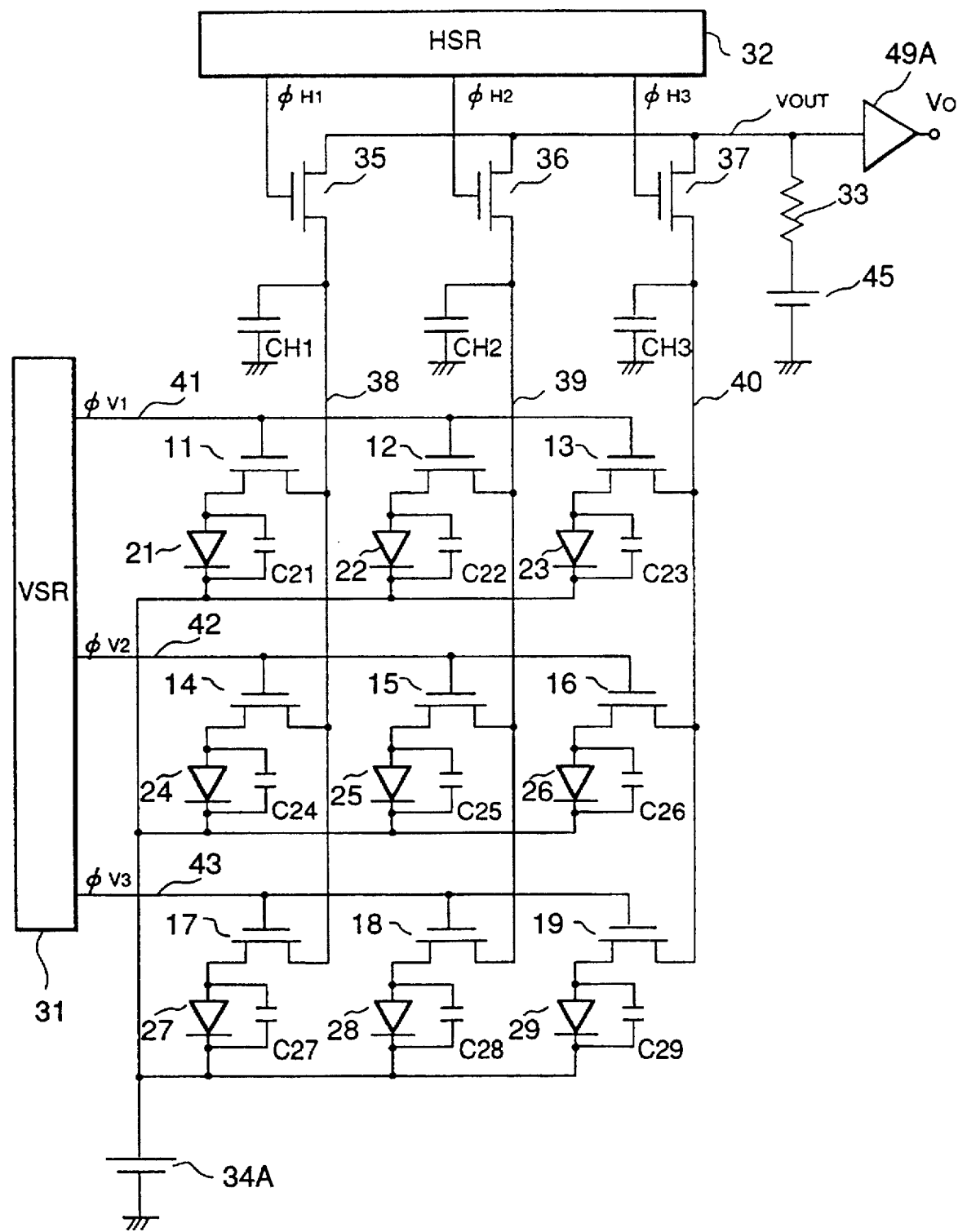
FIG. 20 is a constitution diagram of an infrared-ray image sensor of a fourth embodiment of the present invention.

FIG. 20 shows a constitution of a fourth embodiment of the present invention. As shown in FIG. 20, storing capacitances $CH_1$, $CH_2$, and $CH_3$ of large capacitance are arranged for each of the vertical lines 38 to 40. Furthermore, since the current of diodes is small in its reverse direction, the image sensor of the fourth embodiment is designed such that the diodes are biased in their forward directions, and pixel temperature is detected utilizing the temperature change of the diodes in the forward direction thereby obtaining a thermal image.

Specifically, in the thermal type infrared-ray image sensor shown in FIG. 20, the constitution of the pixel section is the same as that of FIG. 16, which comprises diodes 21 to 29 arranged in a matrix, and MOS transistors for switch elements, each being connected to the anode of corresponding one of the diodes. The diodes 21 to 29 are the same as those of FIGS. 17 and 18. In addition, the parasitic capacitances of the diodes 21 to 29 are denoted as C21 to C29.

In addition, each of the column lines 38 to 40 is connected to the horizontal output line $V_{OUT}$ through the MOS transistors 35 to 37 constituting the horizontal reading out lines, similar to the case of FIG. 16. The gate of each of the MOS transistors 35 to 37 is connected to the horizontal driving circuit 32. Moreover, the gate of each of the switch elements for every row is connected to the vertical driving circuit 31 through the corresponding one of the row selection lines 41 to 43.

The exclusive storing capacitors $C_{H1}$, $C_{H2}$, and $C_{H3}$ are connected between each of the vertical lines 38 to 40 and the ground. It should be noted that parasitic capacitances of the vertical lines 38 to 40 may be used instead of the storing capacitors $C_{H1}$, $C_{H2}$, and $C_{h3}$, or these parasitic capacitances may be used besides the storing capacitors $C_{H1}$, $C_{H2}$, and $C_{H3}$.

Moreover, to bias the diodes of the pixels in a forward direction, for example, the power source of a positive voltage is connected between the resistor and the ground. A voltage of the power source 45 is set to be higher than that of the power source 34 at least by the forward direction voltage $V_f$ (V) of the diode.

Figure 21:
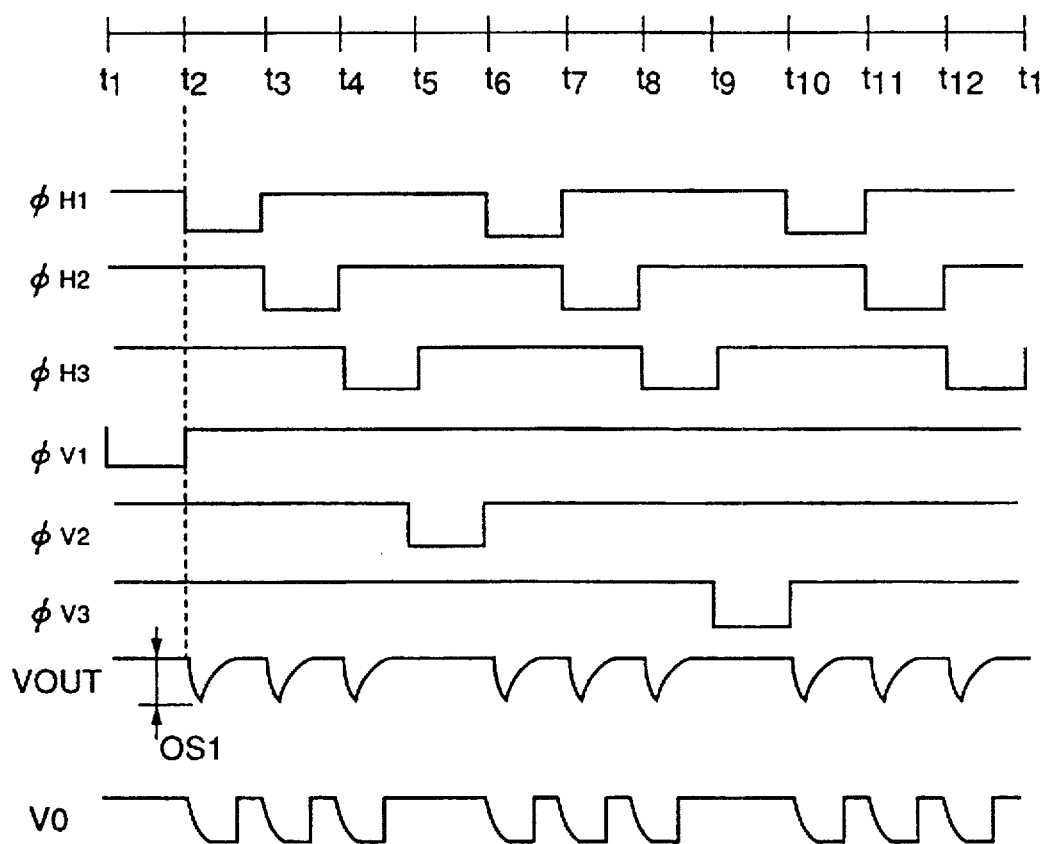
FIG. 21 is a timing chart for explaining an operation of the infrared-ray image sensor of FIG. 20.

Next, an operation of the thermal type infrared-ray image sensor of FIG. 20 will be described with reference to FIG. 21. First of all, it is assumed that the storing capacitors $C_{H1}$, $C_{H2}$, and $C_{H3}$ are in a charged state at a voltage $V_{45}$ of the power source. Next, at time $t_1$ to $t_2$, the row selection signal $V_1$ is at low in level, and the MOS transistors 11 to 13 of the first row are turned on. Thus, each of the storing capacitors $C_{H1}$, $C_{H2}$, and $C_{H3}$ is discharged to the power source 34 through the MOS transistors 11 to 13, and diodes 21 to 23. The voltages of the storing capacitors $C_{H1}$, $C_{H2}$, and $C_{H3}$ begin to change from the voltage $V_{45}$ of the power source 45 to the voltage $V_3$ of the power source 34.

At this time, if $V_{45}=V_3+V_f$ is satisfied, the diodes 21 to 23 will be biased in a forward direction by $V_f$, and the charges of the storing capacitors $C_{H1}$, $C_{H2}$, and $C_{H3}$ are discharged by forward direction currents of the diodes 21 to 23. Moreover, the forward direction currents change according to temperatures thereof.

Next, at time $t_2$ to $t_5$, the row selection signal $V_1$ is rendered to be high in level, so that the MOS transistors 11 to 13 of the first row. The residual charges at time $t_2$ are kept at the storing capacitors $C_{H1}$, $C_{H2}$, and $C_{H3}$. For a period from $t_2$ to $t_5$, the column selection signals $\Phi_{H1}$ to $\Phi_{H3}$ are sequentially rendered to be low in level, so that the horizontal transistors 35 to 37 are sequentially turned on. Thus, the storing capacitors $C_{H1}$, $C_{H2}$, and $C_{H3}$ are recharged from the power source 45.

Specifically, when, for example, the column selection signal $\Phi_{H1}$ is rendered to be low in level so that the horizontal MOS transistor 35 is turned on, the storing capacitor $C_{H1}$ is recharged from the power source 45 through the resistor 33 and the horizontal line $V_{OUT}$. Therefore, the output signal OS shown in FIG. 21 appears at the output terminal Q. The output signal OS becomes saw-tooth waveshape having a height according to the magnitude of the current in a negative direction. The height OS1 of the saw-tooth wavashape shown in FIG. 21 is an output signal value from the first pixel. The desired image signal can be obtained by performing a sample hold for a peak of this saw-tooth waveshape with a sample hold circuit (not shown).

Subsequent to the row selection signal $\Phi_{V1}$, at time $t_5$ and $t_9$, the row selection signals $\Phi_{V2}$ and $\Phi_{V3}$ are sequentially rendered to be low in level, and output signals are sequentially obtained from the second and third pixels. At time $t_{12}$, after an output signal from the final pixel is obtained, returning to time $t_1$ again, the foregoing operations are repeated. In the foregoing operations, for example, for a period from $t_1$ to $t_2$, the charges of the storing capacitors $C_{H1}$, $C_{H2}$, and $C_{H3}$ are discharged by the forward direction currents of the diodes 21 to 23. The voltages of the storing capacitors $C_{H1}$, $C_{H2}$, and $C_{H3}$ begin to change from the voltage $V_4$ to $V_3$. At this time, since $V_{45}=V_3+V_f$ is satisfied as described above, the diode 21 to 23 will be biased in a forward direction by $V_f$.

Assuming that a forward direction current of the diode forward-biased by $V_f$ is $I_f$, an interval between time $t_1$ and time $t_2$ is $T_f$, and $V_f$ and $I_f$ make no change between time $t_1$ and time $t_2$ for the simplicity of the description, the discharged charges $Q_2$ of the storing capacitors are given by the following equation.

$$Q_2 = T_f \times I_f \quad (18)$$

Next, for a period from time $t_2$ to time $t_3$, the column selection signal $\Phi_{H1}$ is at low level, so that the horizontal MOS transistor 35 is in turning on state. The storing capacitor $C_{H1}$ is recharged from the power source 45. This recharging current flows through the resistor 33 and appears at the terminal $V_{OUT}$ as an output signal.

The device of FIG. 20 differs from that of FIG. 16 in that the discharging current is the forward direction current $I_f$ of the diodes in the device of FIG. 20, instead of the reverse current $I_R$, and the storing capacitors $C_{H1}$, $C_{H2}$, and $C_{H3}$ arranged as another components in the device of FIG. 20 are discharged for the storing time $T_f$ by the forward direction current $I_f$ of the diodes, on behalf of discharging the parasitic capacitances of the diodes by the reverse current $I_R$ of the diodes for the storing time T in the device of FIG. 16. Moreover, The changing rate of the discharging current changes from $\alpha$ to $\alpha_f$. Therefore, the analysis performed in the case of FIG. 16 can be applied to the case of FIG. 20, and NETD is given by the following equation.

$$NETD = (1/R\alpha_f)(q/Q_2)^{1/2} \quad (19)$$

$\alpha_f$ is somewhat smaller than $\alpha_r$, about 0.07 V. When $Q_2$ is set at $1.3 \times 10^{-10}$ (C), NETD will be 0.1K so that a good result can be obtained.

In addition, the storing time in the device of FIG. 20, that is, the discharging time Tf of the storing capacitor corresponds to the horizontal retrace period of the television format, it will be about 6 μsec. Therefore, $I_f$ will be 2.2 μA from the equation 10. It is difficult to flow the current of the value 2.2 μA usually in the reverse direction of the diode, because the current value of 2.2 μA is too large to flow in the reverse direction of the diode. However, it is possible to flow in the forward direction easily. At this time, the bias voltage in the forward direction of the diode is about 0.7 V in case of the PN diode, and about 0.3 V in case of the Shottky barrier diode. When the capacitance of the capacitors $C_{H1}$, $C_{H2}$, and $C_{H3}$ is $C_L$ and the charge amount at precharging is $Q_L$ in the same manner that the direct direction current of the diode of FIG. 16 is used, there is the following relationship between $C_L$ and $Q_L$.

$$Q_L = C_L \times V_f \quad (20)$$

Moreover, similar to the foregoing relationship between $Q_0$ and $Q_1$, $Q_L$ must be approximately twice $Q_2$. Therefore, assuming that $Q_L$ be, for example, $2.6 \times 10^{-10}$ C and $V_f$ be 0.7 V, $C_L$ will be $3.7 \times 10^{-10}$ F from the foregoing equation 12.

In the case of the Shottky barrier diode, if $V_f$ is 0. V, $C_L$ will be $8.7 \times 10^{-10}$ F. This capacitance value corresponds to an area of $2.5 \times 10^5$ μm$^2$ of the capacitance used in the semiconductor process in the case where the capacitance is formed of a silicon oxide film of 100 Å serving as an insulating film. It is possible to form the capacitance on an ordinary IC chip.

By setting the resistivity of the resistor 33 at about 50Ω in a case where the capacitance $C_L$ of the storing capacitor is $8.7 \times 10^{-10}$ F, a CR time constant becomes $4.35 \times 10^{-8}$ sec. It will be applicable to the horizontal scanning speed of the television format.

As described above, by arranging the exclusive storing capacitors of large capacitance for every column, the value of $Q_2$ shown in the equation 11 is increased, NETS is improved, and the same performance as the quantum type infrared-ray image sensor can be obtained even in the thermal type infrared-ray image sensor.

It should be noted that the same advantages can be obtained in the image sensor according to the foregoing embodiments, in the event that the conductivity type P-type and N-type of the semiconductor element are reversed.

In addition, in the embodiment of FIG. 20, the voltage of the power source 45 is set to be higher than that of the power source 34 and the diode is biased in a forward direction. Various kinds of circuit constitution can be used to bias the diode in a forward direction. For example, the power source 45 may be removed and the polarity of the power source 34 may be inverted to be negative. Or, in the constitution of FIG. 20, if the constitution that a large reverse current flows through the diode is adopted, each of the diodes can be used by biasing in a reverse direction.

(Fifth Embodiment)

Figure 3:
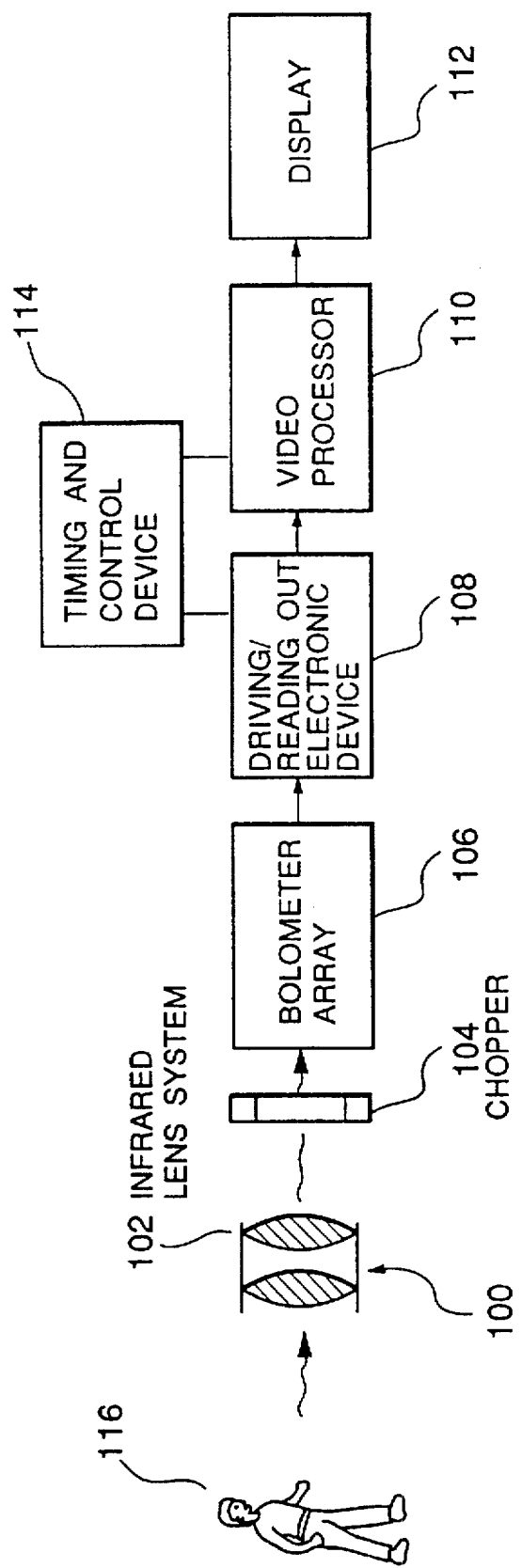
FIG. 3 is a block diagram of an infrared-ray detection system using a bolometer array.

Prior to the description of a thermal type infrared-ray image sensor using a bolometer according to this embodiment, a comparison investigation will be made concerning power consumption and noises between the thermal type infrared-ray image sensor and the conventional image sensors shown in FIGS. 3 to 5.

In this embodiment, since the way to discharge a capacitance with a resistance of the bolometer is employed, the mechanism of generation of the noises and the power consumption differs compared to the conventional one. Assuming that, for example, the capacitor having capacitance C is charged to a voltage $V_B$, it is considered to discharge with the resistor having resistance R. The voltage V of the capacitor is given by the following equation, when time t is used as a variable.

$$V = V_B \exp(-t/CR) \quad (21)$$

By integrating the 21 from time zero to t0, the charge amount $Q_0$ discharged for a period $t_0$ can be obtained.

$$Q_0 = CV_B(1-\exp(-t_0/CR)) \quad (22)$$

In addition, the power $w_0$ consumed by the resistor R for the period $t_0$ is given by the following equation.

$$W_0 = CV_B{}^2(1-\exp(-2t_0/CR)) \quad (23)$$

Next, the power consumption between the conventional method and the method according to the present invention in the television format employing the standard NTSC system is compared. Consideration is made, as conditions, for the case where a signal provided at the time when the resistivity of the bolometer changes by 1% is one hundred times as large as noises.

Figure 4:
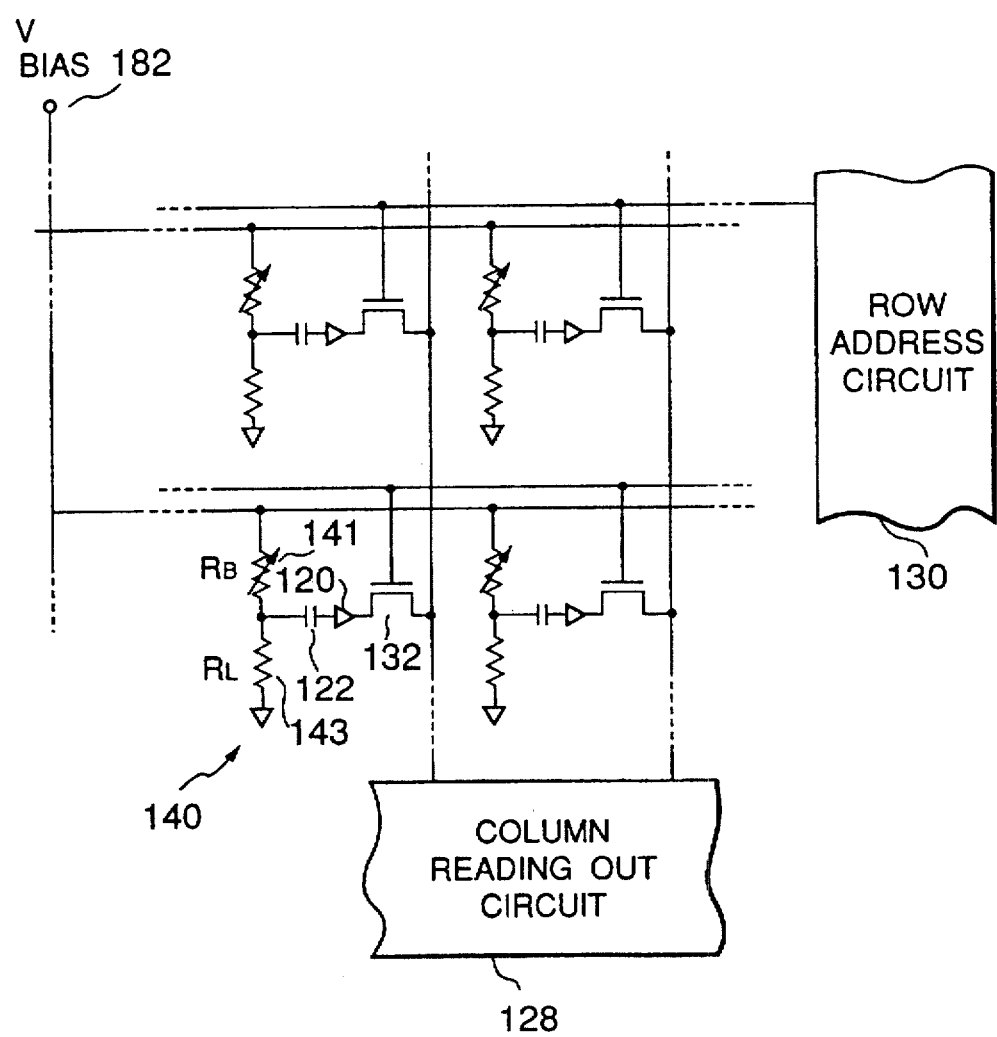
FIG. 4 is a constitution diagram of a conventional infrared-ray image sensor using a bolometer.
Figure 5:
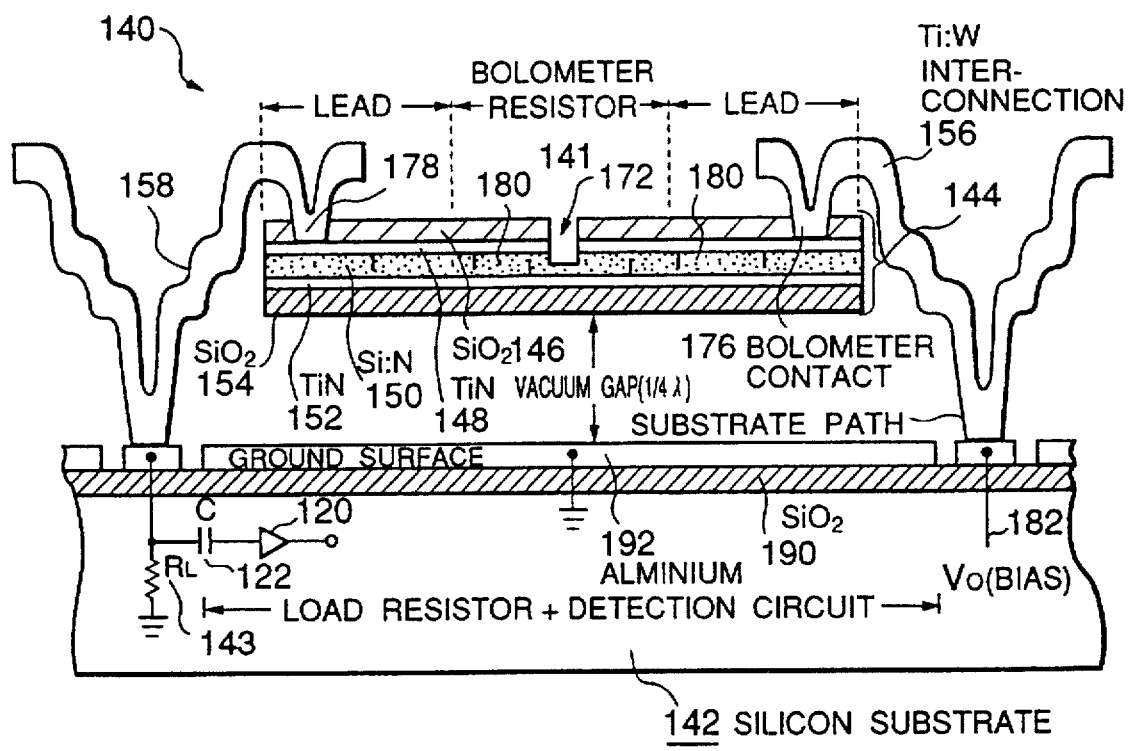
FIG. 5 is a sectional view showing a detailed constitution of a pixel section of the infrared-ray image sensor of FIG. 4.

First, in the conventional method, assuming that the resistivity $R_B$ and $R_L$ shown in FIG. 4 are equal, if the resistivity $R_B$ changes by 1%, an output changes by 0.25% of the bias voltage. On the other hand, noises are obtained by the following equation, assuming that $\Delta$ f=4.2 MHz, k=1.38×10$^{-23}$, and T=300.

$$V_n = 2.637 \times 10^{-7} \times R^{1/2} \tag{24}$$

Furthermore, assuming the foregoing bias voltage V to be 1 V, the signal $V_S$ will be 2.5×10$^{-3}$ V. The following equation is obtained from the equation 24 and the fact that Vs is one hundred times as large as Vn.

$$R = 9(k\Omega) \tag{25}$$

In addition, the power consumption W is obtained by the following equation from the bias voltage 1V, the resistivity R of the equation 25.

$$W = 5.6 \times 10^{-5} (W) \tag{26}$$

Contrary to this, in the present invention, assuming that $t_0$=CR, and the resistivity R changes by 1%, as an example, the difference $\Delta Q_0$ of the charges discharged is given by the following equation.

$$\Delta Q_0 = 3.68 \times 10^{-3} \times CV_B \tag{27}$$

When this difference $\Delta Q_0$ of the charges is converted to the number of the electrons, the number $N_S$ of signal electrons is given by the following equation.

$$N_S = 3.66 \times 10^{-3} \times CV_B/q \tag{28}$$

where q is the charge amount of an electron, and it is 1.6×10$^{-19}$ (C).

Moreover, since noises are shot noise, which can be obtained in the following manner. Specifically, the following equation is obtained by substituting t0=CR for the foregoing equation 22.

$$Q_0 = 0.632 \times CV_B \tag{29}$$

When $Q_0$ shown by the equation 29 is converted to the number of the electrons, $N_0$ is obtained by the following equation.

$$N_0 = 0.632 \times CV_B/q \tag{30}$$

The square root of $N_0$ shown by the equation 30 is the number Nn of the electrons of noises, and Nn is obtained by the following equation.

$$Nn = (0.632 \times CV_B/q)^{1/2} \tag{31}$$

Therefore, under the conditions that NS is one hundred times as large as Nn similarly in the conventional embodiment, CVB is obtained from the equations 28 and 31 as shown by the following equation.

$$CV_B = 7.55 \times 10^{-11} \tag{32}$$

Moreover, assuming that the bias voltage $V_B$ be 1 V similarly in the conventional embodiment, the capacitance C is obtained by the following equation.

$$C = 75.5(pF) \tag{33}$$

Therefore, the power consumption is obtained by the following equation, by C=75.5 pF, $V_B$=1V, and $t_0$=CR for the equation 23.

$$W_0 = 6.5 \times 10^{-11} (W) \tag{34}$$

Since the images of 30 frames per sec are provided in the standard NTSC television system, the power W consumed in one pixel is thirty times as much as the foregoing power consumption $W_0$ in the present invention, and it is given by the following equation.

$$W = 1.95 \times 10^{-9} (W) \tag{35}$$

Therefore, the power consumption according to the present invention will be reduced to 1/28000 of the conventional power consumption shown by the equation 26.

Next, the thermal type infrared-ray image sensor of this embodiment will be described with reference to the drawings in detail.

Figure 22:
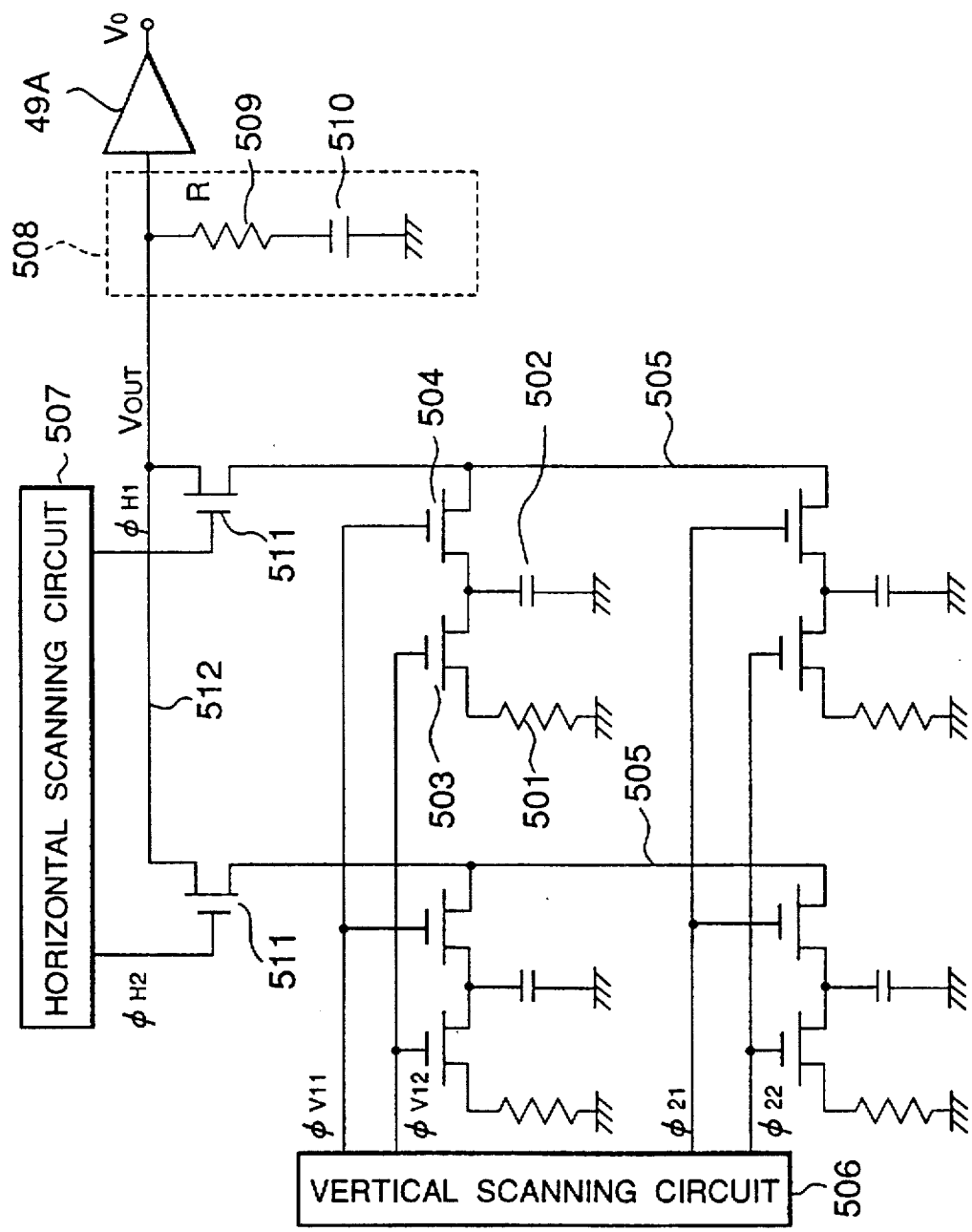
FIG. 22 is a constitution diagram of an infrared-ray image sensor of a fifth embodiment of the present invention.

FIG. 22 shows a schematic constitution of the thermal type infrared-ray image sensor using a bolometer according to the embodiment 5 of the present invention. In the thermal type infrared-ray image sensor shown in FIG. 22, a plurality of pixels are arranged in a matrix, each of which comprises a bolometer 501, a capacitance 502, a MOS switch 503 connected between one terminal of the bolometer 501 and one terminal of the capacitance 502, and a MOS switch 504 connected between one terminal of the capacitance 502 and a vertical signal line 505. In FIG. 22, for the simplicity of the description, a pixel section is shown as a matrix composed of two rows and two columns. However, actually, many pixels, for example, several hundred of pixels, are arranged. The MOS switches 503 and 504 are switching elements constituted by a MOS transistor.

The thermal type infrared-ray image sensor of FIG. 22 further comprises a vertical driving circuit 506, a horizontal driving circuit 507, a reading out circuit 508, and a horizontal MOS switch composed of, for example, a MOS transistor.

One terminal of each of the bolometers 501 is connected to a source of corresponding one of the MOS switchs 503, and a gate of each of the MOS switches 503 is connected to the vertical driving circuit 506. A drain of each of the MOS switches 503 is connected to one terminal of corresponding one of the capacitances 503. The other terminal of each of the bolometers 501 and the other terminal of each of the capacitances 502 are grounded.

One terminal of the capacitance 502, that is, the drain of the MOS transistor 503, is connected to the source of the MOS switch 504. The gate of each of the MOS switch 504 of the same row is, in common, connected to the vertical driving circuit 6. The drain of each of the MOS switch 504 of the same column is connected to corresponding one of the horizontal MOS switch 511 through the vertical signal line 505.

The gate of each of the horizontal MOS switch 511 is connected to the horizontal driving circuit 507, and the drain thereof is connected to the output terminal OS through the horizontal signal line 512.

In this embodiment, the output terminal OS is connected to a reading out circuit 508 outside the thermal type infrared-ray image sensor. The reading out circuit 508 comprises a resistor 509 and a power source 510 connected between the output terminal OS and the ground. It should be noted that the resistor 509 of the reading out circuit 508 may be located within the image sensor.

Figure 23:
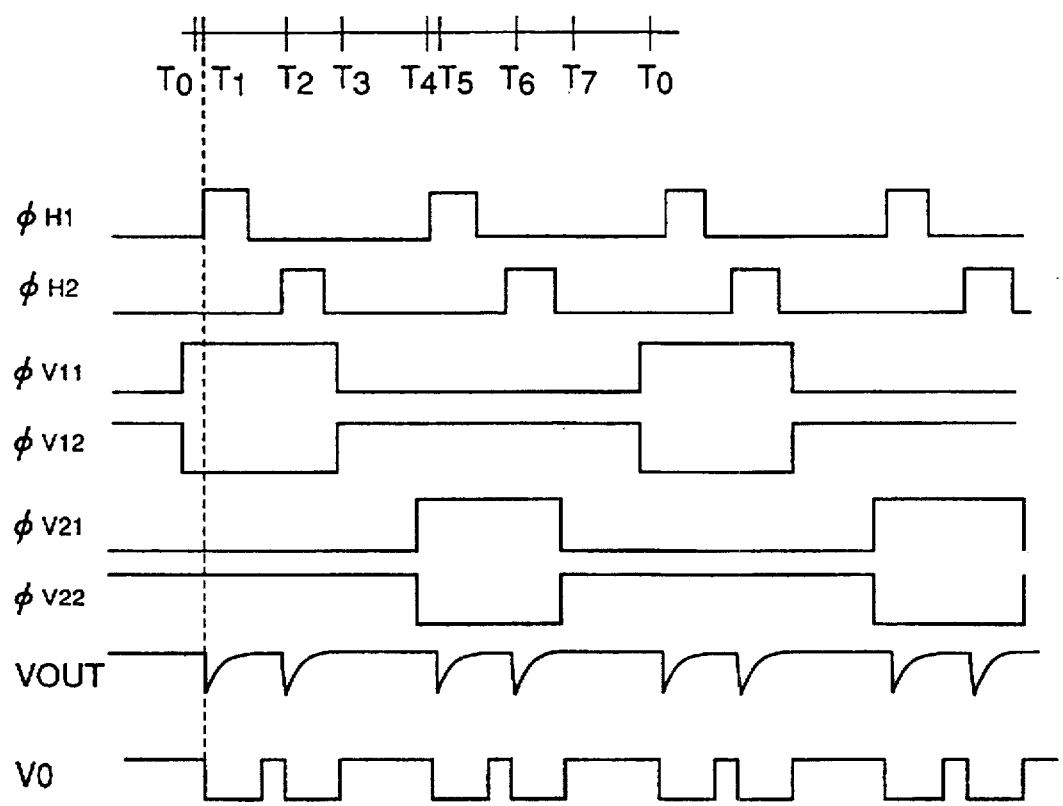
FIG. 23 is a timing chart for explaining an operation of the infrared-ray image sensor of FIG. 22.

FIG. 23 shows signal waveshapes in each of the portions of the thermal type infrared-ray image sensor of FIG. 22. It is assumed that each of the MOS switches of FIG. 22 is constituted of an N-type MOS transistor. Therefore, each of the MOS switches are opened, that is, turned on, when pulse provide thereto are at high in level.

First, at time $T_0$, the vertical driving pulse $\Phi_{V11}$ from the vertical driving circuit 506 is rendered to be high in level so that the MOS switches 506 of the first row are turned on. In addition, at time $T_1$, the horizontal driving pulse $\Phi_{H1}$ from the horizontal driving circuit 507 is rendered to be high in level so that the horizontal MOS switch 511 connected to the signal vertical signal line 505 of the first column is turned on. Thus, the capacitance 502 located at the first row and first column is charged to the voltage of the power source 510 through the power source 510, the resistor 509, the output terminal OS, the horizontal signal line 512, the horizontal MOS switch 511 of the first column, and the MOS switch of the first row and first column.

Next, at time $T_2$, in the state that the vertical driving pulse $\Phi_{V11}$ from the foregoing vertical driving circuit 506 is kept at high, the horizontal driving pulse $\Phi_{H2}$ from the horizontal driving circuit 507 is rendered to be high in level, so that the capacitance 502 at the first row and the second column, located at the top-left in FIG. 22, is charged to a voltage of the power source 510.

Subsequently, at time $T_3$, the vertical driving pulse $\Phi_{V11}$ is rendered to be low in level so that the MOS switches 504 at the first row are turned off. The vertical driving pulse $\Phi_{12}$ is rendered to be high in level so that MOS switches 503 are turned on. Thus, the charges stored in the capacitances 502 in the pixel at the first row begin to be discharged through the resistors 501 of the bolometer. This discharging continues until the vertical driving pulse $\Phi_{V12}$ is rendered to be low in level at the next time $T_0$. The magnitude of the discharging current at this discharging varies according to the resistivity of the bolometers 501.

Next, for a period from time $T_4$ to $T_7$, the vertical driving pulse $\Phi_{V21}$ from the vertical driving circuit 506 is kept at high, so that the capacitances 502 of the pixels at the second row are sequentially charged to a voltage of the power source 510. This operation is the same as that described above for the pixels at the first row. After this charging, a sequence of the operation returns to time $T_0$.

When returning to time $T_0$, the driving pulse from the vertical driving circuit 506 is again rendered to be high in level so that the MOS switches 504 of the pixels at the first row are turned on. Then, at time $T_1$ and $T_2$, the horizontal driving pulses $\Phi_{H1}$ and $\Phi_{H2}$ from the horizontal driving circuit 507 are sequentially rendered to be high in level, so that the horizontal MOS switches 505 are sequentially turned on. Therefore, at time $T_1$ and $T_2$, the capacitances 502 at the first and second columns are recharged through the power source 510 and the resistor 509, respectively.

The recharged amount changes according to the residual charges in the bolometer 501. Specifically, the recharged amount decreases as the residual charges in the capacitance 502 is much, and, consequently, the recharging current flowing through the resistor 509 decreases. On the other hand, when the residual charges in the capacitance 502 decrease, the recharged amount increases and the recharging current flowing through the resistor 509 increases. Therefore, if the recharging current flowing through the resistor 509 is fetched out as an output, a signal according to the residual charges of each of the capacitances, in other word, the resistivity or of each of the bolometers 1, can be obtained. The recharging current flowing through the resistor 509 becomes a signal waveshape looking down as shown by $V_{OUT}$ in FIG. 23. By holding the peak of the signal waveshape looking down with a peak hold circuit (not shown), a desired image signal can be obtained.

Figure 24:
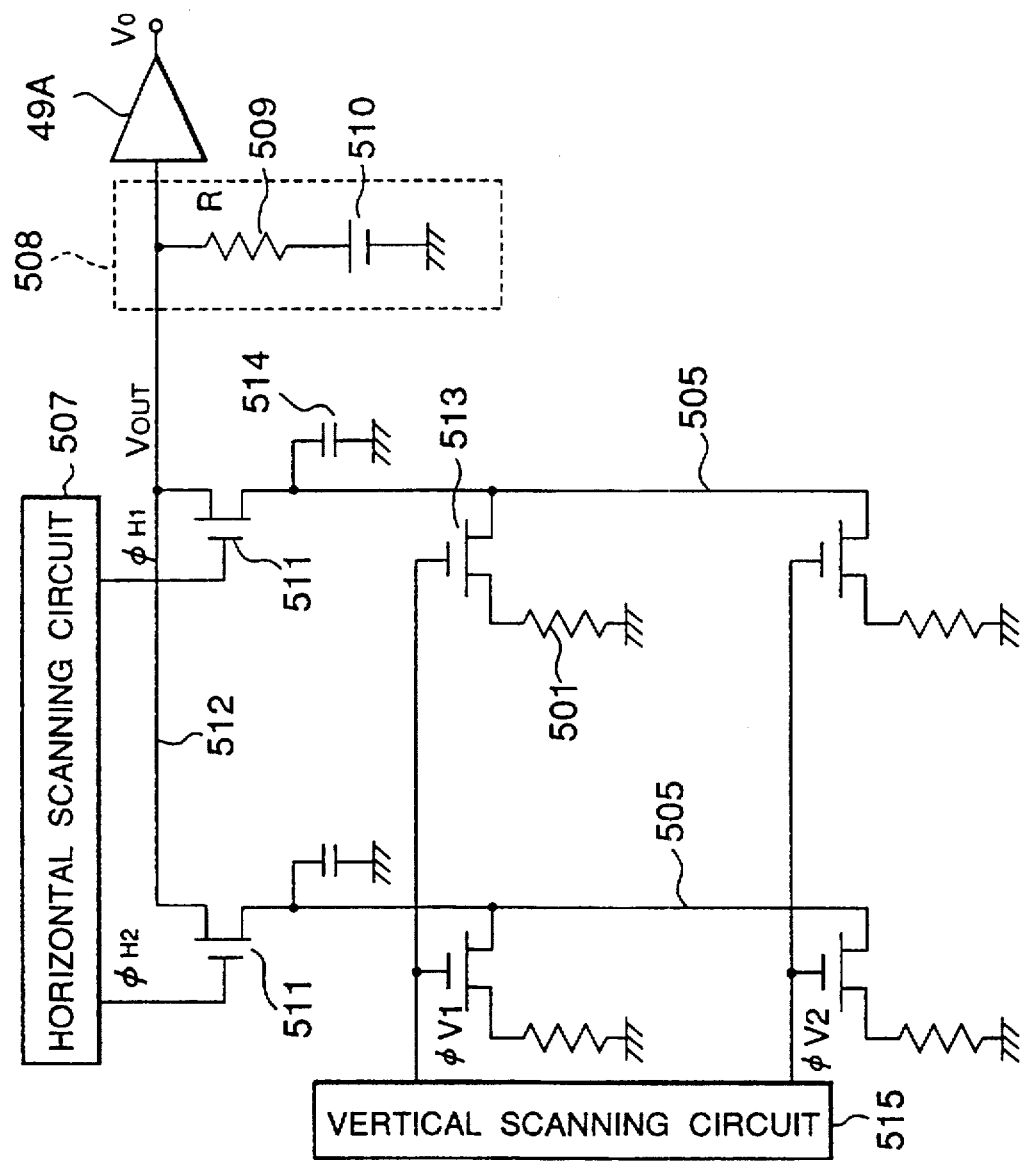
FIG. 24 is a constitution diagram showing a modified example of the infrared-ray image sensor of the fifth embodiment.

FIG. 24 shows a schematical constitution of a thermal type infrared-ray image sensor according to a modified example of the fourth embodiment of the present invention. In the thermal type infrared-ray image sensor, each of pixels consists of a bolometer 1 and an MOS switch 513 composed of an MOS transistor, and is arranged in a matrix. In FIG. 24, for simplicity of the description, an example in which the pixels are arranged in a matrix composed of two rows and two columns. Actually, the matrix comprises many rows and columns.

In each of the pixels, one terminal of the bolometer 1 is connected to a source of the MOS switch 513, a gate of which is connected commonly to a vertical driving circuit 515 every row. Each of drains of the MOS switches 513 is connected commonly to a vertical signal line 505 every column. The other terminal of the bolometer 1 is grounded.

A capacitance 514 is arranged between the vertical signal line 505 and the ground. In addition, the vertical signal line 505 is connected to a source of a horizontal MOS switch 511. A gate of the MOS switch 511 is connected to is connected to a horizontal driving circuit 507, a drain of which is connected to an output terminal OS through a horizontal signal line 512. The output terminal OS is connected to a reading out circuit 508 located outside the image sensor, similar to the case of FIG. 22. The reading out circuit 508 consists of a resistor 508 and a power source 510, connected in series between the output terminal OS and the ground.

Figure 25:
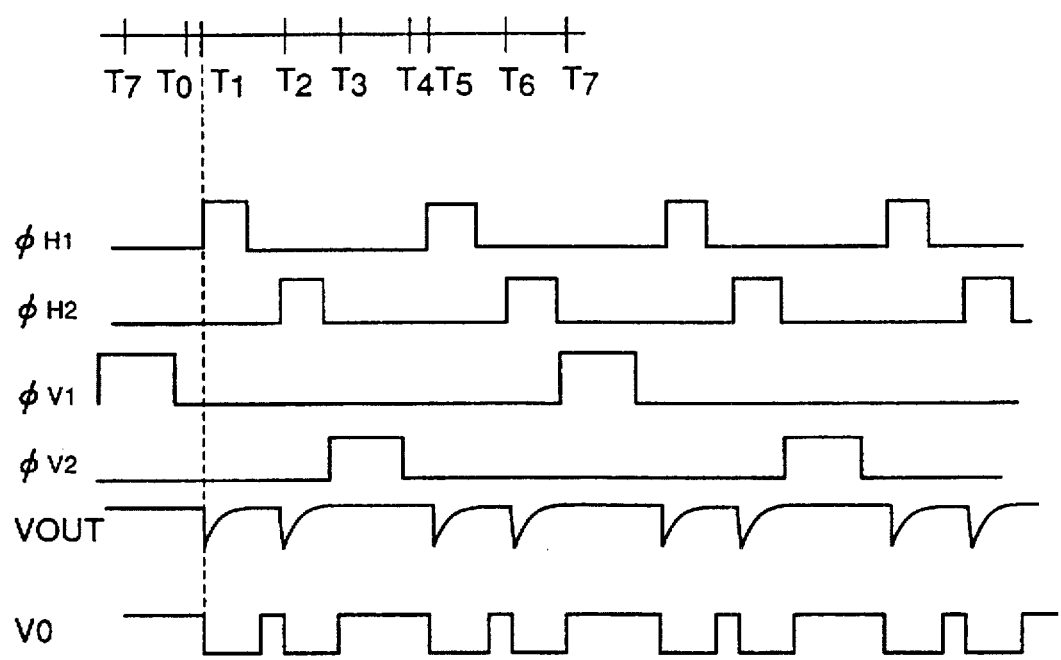
FIG. 25 is a timing chart for explaining an operation of the infrared-ray image sensor of FIG. 24.

Next, an operation of the thermal type infrared-ray image sensor according to the foregoing modified example of the fourth embodiment of the present invention will be described with reference to FIG. 25. First, at time $T_1$, the horizontal driving pulse $\Phi_{H1}$ supplied with the horizontal driving circuit 507 is rendered to be high in level, so that the horizontal MOS switch 511 of the first column is turned on. Thus, the capacitance 514 connected to the vertical signal line 505 of the first column is charged to a voltage of the power source 510 through the resistor 509, the horizontal signal line 512, and the horizontal MOS switch 511. Next, at time $T_2$, the horizontal driving pulse $\Phi_{H2}$ supplied from the horizontal driving circuit 507 is rendered to be high in level so that the capacitance 514 connected to the vertical signal line 505 of the second column is charged to the voltage of the power source 510.

Next, at time $T_3$, the vertical driving pulse $\Phi_{V2}$ supplied from the vertical driving circuit 515 is rendered to be high in level so that the MOS transistors 513 of the pixels at the second row are turned on. Thus, the charges of the capacitance 514 of each column begin to be discharged through the bolometers 510 of the second row. The magnitude of the discharging current at the time of this discharging is determined by the resistivity of each of the bolometers 501.

At time $T_4$, the vertical driving pulse $\Phi_{V2}$ is rendered to be high in level, the discharging of the capacitances 514 of each column is completed. Therefore, at this point of time, the residual charges stored in the capacitance 514 of each column decrease as the resistivity of the corresponding bolometer 501 is small.

Next, at time T5, the horizontal driving pulse $\Phi_{H1}$ is rendered to be high in level from the horizontal driving circuit 507 so that the MOS switch 511 of the first column is turned on. Thus, the capacitance 514 is recharged by the power source 510 through the load resistor 509, the horizontal signal line 512, and the horizontal MOS switch 511. The recharged charges are equal to the charges discharged by the bolometer 501 arranged at the first column and the second row for a period from time $T_3$ to $T_4$. The current flowing on the recharging, that is, the recharging current, flows from the resistor 509 to the terminal OS and appears at the terminal OS as an output signal voltage waveshape.

Next, at time $T_6$, the horizontal driving pulse $\Phi_{H2}$ from the horizontal driving circuit 507 is rendered to be high in level so that the horizontal MOS switch 511 of the second column is turned on. Thus, the capacitance 514 of the second column is recharged by the power source 510 through the resistor 509, the horizontal signal line 512, and the horizontal MOS switch 511, similar to the foregoing case. The current produced due to this recharging appears as a peak waveshape looking downward at the output terminal OS similar to the foregoing case.

Similarly, for a period from time $T_7$ to $T_0$, the capacitance 514 of each column is discharged by the bolometer 501, and for a period from time $T_1$ to $T_2$, the capacitance 514 is recharged by the power source 510. Thus, an output signal waveshape according to the resistivity of the bolometer 501 of the first and second columns at the first row is sequentially obtained.

In the thermal type infrared-ray image sensor according to the modified example of FIG. 24, since the capacitance 514 is arranged for every column, an area for forming the capacitance on an integrated circuit can be reduced compared to the constitution of FIG. 22, and the constitution can be simplified. In addition, each of the capacitances 514 is connected between the vertical signal line 505 and the ground, a parasitic capacitance of the vertical signal line 505 can be used instead of the capacitance 514, or it may be used by adding it to the capacitance 514. Thus, an area on the integrated circuit required for formation the capacitance 514 can be further reduced.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application Nos. 289543/1995 filed on Nov. 8, 1995, 345549/1995 filed on Dec. 8, 1995, 049716/1996 filed on Mar. 7, 1996 and 199609/1996 filed on Jul. 10, 1996 are hereby incorporated by reference.

What is claimed is:

1. An infrared-ray image sensor, comprising:

a light receiving section including a plurality of Shottky barrier diodes accompanied with stray capacitance, said Shottky barrier diodes being arranged in a matrix defined in first and second direction, each of said Shottky barrier diodes having a first terminal set at a reference potential level and changing a reverse current responding to a temperature change due to infrared-ray irradiation;

a conduction selection section for connecting alternatively a second terminal of each of said Shottky barrier diodes to a common terminal electrically, responding to a selection signal as to said first direction and a selection signal as to said second direction;

a reverse bias applying section being connected to said common terminal for applying a reverse bias voltage to said selected Shottky barrier diode, charging the capacitance belonging to said selected Shottky barrier diode, and producing a voltage signal according to a reverse current of said selected Shottky barrier diode on said common terminal;

a scanning section for selecting sequentially said Shottky barrier diodes, and issuing a conduction instruction signal for instructing a conduction of the second terminal of said selected Shottky barrier diode to said common terminal for a determined period of time.

2. The infrared-ray image sensor according to claim 1, wherein an arrangement number of said Shottky barrier diodes in the first direction is a first number, and an arrangement number of said Shottky barrier diodes in the second direction is a second number;

said conduction selection section comprises:

first switch elements of the same number as that of said Shottky barrier diodes, each of said first switch elements is arranged for corresponding one of the Shottky barrier diodes, and connecting a first terminal to a second terminal of the first switch element responding to the selection signal as to the first direction supplied to a third terminal of the first switch element, the first terminal of each of said first switch elements being electrically connected to the second terminal of corresponding one of said Shottky barrier diodes, the second terminals of the second number of said first switch elements located on the same line in said first direction being electrically connected each other, and the third terminals of the first number of said first switch elements located on the same line in said second direction being electrically connected each other; and second switch elements of the second number, each of said second switch element is arranged for corresponding one of the second number of said Shottky barrier diodes located on the same line in said first direction, and connects a first terminal to a second terminal of the second switch element responding to the selection signal in said second direction supplied to a third terminal of the second switch element, the first terminal of each of said second switch elements being connected to the second terminal of corresponding one of said first switch elements, and the second terminal of each of said second switch elements being connected to said common terminal.

3. The infrared-ray image sensor according to claim 1, an arrangement number of said Shottky barrier diodes in the first direction is a first number, and an arrangement number of said Shottky barrier diodes in the second direction is a second number;

said conduction selection section comprises:

first switch elements of the same number as that of said Shottky barrier diodes, each of said first switch element is arranged for corresponding one of the Shottky barrier diodes, and connects a first terminal to a second terminal of the first switch element responding to the selection signal as to the first direction supplied to a third terminal of the first switch element; the first terminal of each of the first switch elements being electrically connected to the second terminal of corresponding one of the Shottky barrier diodes; and second switch elements of the same number as that of the Shottky barrier diodes, each of said second switch elements is arranged for corresponding one of said first switch elements, and connects a first terminal to a second terminal of the second switch element responding to the selection signal as to the second direction supplied to a third terminal of the second switch element, the first terminal of each of said second switch elements being connected to the second terminal of corresponding one of said first switch elements, and the second terminal of each of said second switch elements being connected to said common terminal.

4. The infrared-ray image sensor according to claim 1, wherein a value of a Shottky barrier of said Shottky barrier diode is not less than 0.7 eV and not more than 0.9 eV.

5. The infrared-ray image sensor according to claim 1, wherein said Shottky barrier diode comprises a semiconductor substrate and a metal silicide layer formed at a predetermined region on a surface of said semiconductor substrate, and a discharging time for discharging a capacitance belonging to said Shottky barrier diode is not more than 1/30 sec.

6. The infrared-ray image sensor according to claim 5, wherein a value of a Shottky barrier of said Shottky barrier diode is not less than 0.75 eV and not more than 0.85 eV.

7. The infrared-ray image sensor according to claim 5, wherein said semiconductor substrate is an n-type silicon substrate having a surface of a surface orientation <111> on which said metal silicide layer is formed, and said metal silicide layer is a platinum silicide layer.

8. The infrared-ray image sensor according to claim 5, wherein said semiconductor substrate is an n-type silicon substrate having a surface of a surface orientation <111> on which said metal silicide layer is formed, and said metal silicide layer is a nickel silicide layer.

9. The infrared-ray image sensor according to claim 1, wherein said image sensor further comprises:
- a charge supply device for supplying charges for precharging the capacitance belonging to said Shottky barrier diode;
- a precharge selection section for connecting a charge supply terminal of said charge supply device to the second terminal of more than one of said selected Shottky barrier diodes according to a precharge selection signal; and
- a precharge control section for issuing said precharge selection signal, synchronized with the selection signal as to said first direction and the selection signal as to said second direction.

10. The infrared-ray image sensor according to claim 9, wherein a value of a Shottky barrier of said Shottky barrier diode is not less than 0.53 eV and not more than 0.7 eV.

11. The infrared-ray image sensor according to claim 1, wherein said reverse bias applying section comprises,
- a power source for providing a predetermined voltage so as to set said Shottky barrier diode at a reverse bias state, when the second terminal of said Shottky barrier diode is supplied with the voltage; and
- a resistance element having a first terminal electrically connected to an output terminal of said power source and having a second terminal electrically connected to said common terminal.

12. The infrared-ray image sensor according to claim 1, wherein said image sensor further comprises a peak hold circuit for receiving a voltage signal produces at said common terminal and holding a peak voltage value of a waveshape of said voltage signal.

13. An infrared-ray image sensor comprising:
- a light receiving section which includes a plurality of diodes accompanied with a stray capacitance, said diodes being arranged in a matrix defined in first and second direction, each of said diodes having a first terminal set at a reference potential level and changing its current characteristic according to a temperature change due to infrared-ray irradiation;
- first switch elements of the same number as that of said diodes, each of first switch elements being arranged for corresponding one of said diodes, and connecting a first terminal to a second terminal of the first switch element responding to a conduction instruction signal composed of a selection signal as to said first direction and a selection signal as to said second direction supplied to a third terminal of the first switch element, the first terminal of said first switch element being connected electrically to a second terminal of said corresponding diode;
- at least one capacitance element, a first terminal of said capacitance element being electrically connected to the second terminal of a predetermined number of the first switch element, and a second terminal of said capacitance element being set at said reference potential level, the second terminal of the capacitance element being electrically connected to the first terminal of one of said capacitances;
- a conduction selection section for connecting alternatively the first terminal of each of said capacitances to a common terminal electrically, responding to a conduction instruction signal;
- a charge supply section connected to said common terminal for which applying a voltage between first and second terminals of said selected capacitance element to charge said selected capacitance, and producing a voltage signal on said common terminal according to a discharge amount at said diode; and
- a scanning section for selecting sequentially one of said diodes, instructing opening/closing operations of said first switch element corresponding to said selected diode, and issuing a conduction instruction signal for instructing a conduction of the first terminal of said capacitance and said common terminal for a predetermined period of time, said capacitance being corresponding to said diode.

14. The infrared-ray image sensor according to claim 13, wherein said diode is a Shottky barrier diode.

15. The infrared-ray image sensor according to claim 13, wherein a voltage of said voltage signal produced by said charge supply section is the one to set said diode at a forward bias state when it is supplied to said diode.

16. The infrared-ray image sensor according to claim 13, wherein
an arrangement number of said diodes in the first direction is a first number, and an arrangement number of said diodes in the second direction is a second number; and said image sensor further comprises the first number of wirings, each of said wirings is accompanied with a stray capacitance, and are connected electrically to the second terminals of the first switch elements of the second number located on the same line in said first direction.

17. The infrared-ray image sensor according to claim 16, wherein said capacitance element is composed of the stray capacitance of said wiring.

18. The infrared-ray image sensor according to claim 16, wherein said image sensor further comprises capacitance devices arranged for each of the wirings accompanied with said capacitance, and each of said capacitance elements is composed of the stray capacitance of the wiring and said capacitance part.

19. The infrared-ray image sensor according to claim 16, wherein said conduction selection section comprises second switch elements of the first number, each of said second switch element being arranged to corresponding one of the second number of said diodes located on the same line in the first direction, connecting a first terminal to a second terminal of the second switch element responding to a selection signal as to the first direction supplied to a third terminal of the second switch element, the first terminal of said second switch element being connected to the second terminal of said corresponding first switch element, and the second terminal of said second switch elements being connected to said common terminal.

20. The infrared-ray image sensor according to claim 13, wherein said charge supply section comprises:
- a power source for providing a predetermined voltage; and a resistance element having a first terminal electrically connected to an output terminal of said power source and a second terminal electrically connected to said common terminal.

21. The infrared-ray image sensor according to claim 13, wherein said image sensor further comprises a peak hold circuit for receiving a voltage signal produced at said common terminal, and holding a peak voltage value of a waveshape of said voltage signal.

22. An infrared-ray image sensor, comprising:

a light receiving section including bolometers, said bolometers being arranged in a matrix defined by first and second directions, and changing the resistivity according to temperature change due to infrared-ray irradiation, a first terminal of each of said bolometers being set at a reference potential level;

first switch elements of the same number as that of said bolometer, each of said first switch element being arranged for corresponding one of said bolometers and connects a first terminal to a second terminal of the first switch element responding to a conduction instruction signal composed of a selection signal as to the first direction and a selection signal as to the second direction, the composed signal being supplied to a third terminal of the first switch element, and the first terminal of said first switch element being electrically connected to a second terminal of said bolometer;

at least one capacitance element having a first terminal electrically connected to the second terminal of a predetermined number of said first switch element and having a second terminal set to be said reference potential level, the second terminal of respective first switch element being electrically connected to the first terminal of one of said capacitance elements;

a conduction selection section for connecting alternatively the first terminal of each of said capacitance elements to a common terminal electrically;

a charge supply section connected to said common terminal for applying a voltage between the first and second terminals of said selected capacitance element, charging said selected capacitance element, and producing a voltage signal according to a discharge amount at said bolometer on said common terminal; and a scanning section for selecting sequentially one of said bolometers, instructing opening/closing operations of said first switch element corresponding to said selected bolometer, and issuing a conduction instruction signal for instructing a conduction of the first terminal of said capacitance and said common terminal for a predetermined period of time, said capacitance being corresponding to said diode.

23. The infrared-ray image sensor according to claim 22, wherein an arrangement number of said bolometers in the first direction is a first number, and an arrangement number of said bolometers in the second direction is a second number; and said image sensor further comprises the first number of wirings connected electrically to the second terminals of the second number of said first switch elements located on the same line in said first direction, said wirings being accompanied with a stray capacitance.

24. The infrared-ray image sensor according to claim 23, wherein said capacitance elements is composed of the stray capacitance of said wiring.

25. The infrared-ray image sensor according to claim 23, wherein said image sensor further comprises capacitance devices arranged for each of said wirings, and said capacitance element is composed of the capacitance of the wiring accompanied with said capacitance and said capacitance part.

26. The infrared-ray image sensor according to claim 23, wherein said conduction selection section comprises second switch elements of the first number, each of said second switch elements is arranged for corresponding one of the second number of said bolometers located on the same line in the first direction, connects a first terminal to a second terminal of the second switch element responding to a selection signal as to the first direction supplied to a third terminal of the second switch element; the first terminal of said second switch element being connected to the second terminal of said corresponding first switch element, and the second terminal of said second switch element being connected to said common terminal.

27. The image sensor according to claim 22, wherein said capacitance element is a capacitance device arranged for each of said bolometers, a first terminal of said capacitance part being electrically connected to the second terminal of said first switch element, and a second terminal thereof being set at said reference potential.

28. The infrared-ray image sensor according to claim 27, wherein an arrangement number of said bolometers in said first direction is a first number, and an arrangement number of said bolometers in said second direction is a second number, and said conduction selection section comprises:

second switch elements of the same number as that of said bolometers, each of said second switch element connects a first terminal to a second terminal of the second switch element according to a selection signal as to said second direction supplied to a third terminal of the second switch element, the first terminal of each of said second switch element being connected to the second terminal of corresponding one of said first switch elements, and the second terminal of the second number of said second switch elements located on the same line in said first direction being electrically connected to said common terminal; and the first number of third switch elements, each of which connects a first terminal to a second terminal of the third switch element responding to a selection signal as to said first direction supplied to a third terminal of the third switch element, the first terminal of each of said second switch elements being connected to the second terminal of corresponding one of said second switch elements, and the second terminal of each of said third switch elements being connected to said common terminal.

29. The infrared-ray image sensor according to claim 22, wherein said charge supply section comprises:

a power source for providing a predetermined potential; and a resistance element having a first terminal electrically connected to an output terminal of said power source and having a second terminal electrically connected to said common terminal.

30. The infrared-ray image sensor according to claim 22, wherein said image sensor further comprises a peak hold circuit for receiving a voltage signal produced at said common terminal, and holding a peak voltage value of a waveshape of said voltage signal.

* * * * *